United States Patent
Matsumura et al.

(10) Patent No.: US 7,285,375 B2
(45) Date of Patent: *Oct. 23, 2007

(54) PHOTOSENSITIVE COMPOSITION, PHOTOSENSITIVE LITHOGRAPHY PLATE AND METHOD FOR PRODUCING LITHOGRAPHY PLATE

(75) Inventors: Toshiyuki Matsumura, Fujino-machi (JP); Norio Miura, Sagamihara (JP)

(73) Assignee: Konica Minolta Medical & Graphic, Inc., Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 10/558,505

(22) PCT Filed: May 31, 2004

(86) PCT No.: PCT/JP2004/007861

§ 371 (c)(1),
(2), (4) Date: Nov. 28, 2005

(87) PCT Pub. No.: WO2004/109402

PCT Pub. Date: Dec. 16, 2004

(65) Prior Publication Data

US 2007/0020555 A1 Jan. 25, 2007

(30) Foreign Application Priority Data

Jun. 3, 2003 (JP) .............................. 2003-157801
Sep. 11, 2003 (JP) .............................. 2003-319531

(51) Int. Cl.
G03F 7/029 (2006.01)
G03F 7/031 (2006.01)
G03F 7/033 (2006.01)
G03F 7/028 (2006.01)
G03F 7/14 (2006.01)

(52) U.S. Cl. .............................. 430/280.1; 430/281.1; 430/286.1; 430/287.1; 430/288.1; 430/302; 430/914; 430/916

(58) Field of Classification Search ............. 430/270.1, 430/280.1, 281.1, 286.1, 287.1, 288.1, 302, 430/494, 945, 914, 916
See application file for complete search history.

(56) References Cited

U.S. PATENT DOCUMENTS

| | | | |
|---|---|---|---|
| 6,413,697 B1 | 7/2002 | Melisaris et al. | |
| 7,147,989 B2 * | 12/2006 | Kuroki et al. | 430/281.1 |
| 2004/0023136 A1 * | 2/2004 | Munnelly et al. | 430/18 |
| 2004/0091816 A1 * | 5/2004 | Matsumura et al. | 430/281.1 |
| 2005/0037286 A1 * | 2/2005 | Hirabayashi et al. | 430/281.1 |

FOREIGN PATENT DOCUMENTS

| | | |
|---|---|---|
| EP | 1 413 925 A2 * | 4/2004 |
| JP | 10-161308 A | 6/1998 |
| JP | 2002-509982 A | 4/2002 |

* cited by examiner

*Primary Examiner*—Richard L. Schilling
(74) *Attorney, Agent, or Firm*—Frishauf, Holtz, Goodman & Chick, P.C.

(57) ABSTRACT

Disclosed is a light sensitive composition containing a compound A having a group capable of undergoing radical polymerization, a compound B having a group capable of undergoing cationic polymerization, a photopolymerization initiator C, and a polymer binder D, the light sensitive composition being characterized in that the photopolymerization initiator C comprises an iron-arene complex and a halogenated alkyl group-containing compound.

8 Claims, No Drawings

PHOTOSENSITIVE COMPOSITION, PHOTOSENSITIVE LITHOGRAPHY PLATE AND METHOD FOR PRODUCING LITHOGRAPHY PLATE

This application is the United States national phase application of International Application PCT/JP2004/007861 filed May 31, 2004.

FIELD OF THE INVENTION

The present invention relates to a light sensitive composition, a light sensitive planographic printing plate material and a manufacturing method of a printing plate, and particularly to a light sensitive composition, a light sensitive planographic printing plate material and a manufacturing method of a printing plate, providing high sensitivity and excellent printing durability.

BACKGROUND OF THE INVENTION

Generally, a negative working light sensitive planographic printing plate material is imagewise exposed to harden the exposed portions, dissolving away the unexposed portions, washed with water, and subjected to finisher gumming treatment to obtain a planographic printing plate. In recent years, an attempt has been made in which after digital exposure is made based on image information employing a laser light in order to provide high dissolving power and sharpness, development treatment is carried out to obtain a planographic printing plate. For example, there is a system for preparing a planographic printing plate, in which a light source is modulated based on image information transported from a communication line, or based on output signals from an electronic plate making system or an image processing system, a light sensitive material is directly scanning exposed employing the light source.

There is a problem in a conventional planographic printing plate material employing a diazo resin in that it is difficult to increase sensitivity or to carry out spectral sensitization for meeting an emission wavelength of a laser for digital exposure In order to obtain high sensitivity.

In recent years, as a light sensitive material suitable for laser exposure, which can increase sensitivity and carry out spectral sensitization, a planographic printing plate material has been noted which comprises a photopolymerizable light sensitive layer containing a photopolymerization initiator. However, a planographic printing plate material for CTP (Computer To Plate) for recording a digital image according to laser-exposure is generally poor in printing durability. A printing plate material with high printing durability has been desired in various printing industries such as newspaper printing or commercial printing industries.

In order to obtain high sensitivity, a method of employing a photopolymerization has been studied, and a method of employing an s-triazine compound as a photopolymerization initiator has been proposed (see, for example, Japanese Patent O.P.I. Publication Nos. 48-36281, 54-74887, and 64-35548.). However, this method could not provide satisfactory sensitivity. Further, a technique of employing a combination of an iron-arene compound and a peroxide as a photopolymerization initiator has been proposed (see, for example, Japanese Patent O.P.I. Publication No. 59-219307.). However, this technique also could not provide satisfactory sensitivity.

In order to obtain high printing durability, there have been disclosed a technique employing a titanocene compound as a photopolymerization initiator (see Japanese Patent O.P.I. Publication Nos. 2001-209170 and 2001-183822), a technique employing autoagglutination of urethane bond of a urethane resin (see Japanese Patent O.P.I. Publication No. 2001-100412), a technique employing a an ethylenically unsaturated compound containing a phosphate ester bond (see Japanese Patent O.P.I. Publication No. 10-10719), and a technique employing a silane coupling agent or employing a diazonium compound disclosed in Japanese Patent O.P.I. Publication No. 2001-249444. These techniques are not satisfactory, and a method solving the above problems has been desired.

Accordingly, an object of the invention is to provide a light sensitive composition, a light sensitive planographic printing plate material and a manufacturing method of a printing plate, providing high sensitivity and excellent printing durability.

DISCLOSURE OF THE INVENTION

The above object of the invention can be attained by one of the following constitutions:

1. A light sensitive composition containing a compound A having a group capable of undergoing radical polymerization, a compound B having a group capable of undergoing cationic polymerization, a photopolymerization initiator C, and a polymer binder D, wherein the photopolymerization initiator C comprises an iron-arene complex and a halogenated alkyl group-containing compound.

2. The light sensitive composition of item 1 above, wherein the halogenated alkyl group-containing compound is at least one selected from the group consisting of a trichloromethyl group-containing compound, a tribromomethyl group-containing compound, a dichloromethyl group-containing compound, and a dibromomethyl group-containing compound.

3. The light sensitive composition of item 1 or 2 above, wherein the compound B having the group capable of undergoing cationic polymerization further has a group capable of undergoing radical polymerization, the group capable of undergoing cationic polymerization comprising any one of an oxirane ring, an oxetane ring and a dioxolane ring in the chemical structure.

4. The light sensitive composition of any one of items 1 through 3 above, wherein the compound B is a compound represented by the following formula (A):

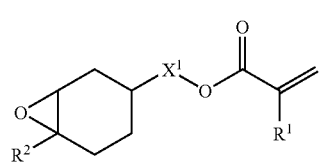

Formula (A)

wherein $R^1$ represents a hydrogen atom, or a methyl group; $R^2$ represents an alkyl group; and $X^1$ represents a single bond or a divalent organic group.

5. The light sensitive composition of any one of items 1 through 3 above, wherein the compound B is at least one selected from the group consisting of a compound represented by the following formula (B) and a compound represented by the following formula (C):

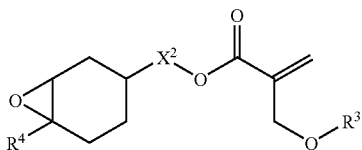

Formula (B)

wherein R³ represents a substituted or unsubstituted alkyl group, a substituted or unsubstituted aryl group or a substituted or unsubstituted acyl group; R⁴ represents a hydrogen atom or an alkyl group; and X² represents a single bond or a divalent organic group.

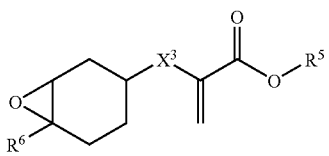

Formula (C)

wherein R⁵ represents a substituted or unsubstituted alkyl group or a substituted or unsubstituted aryl group; R⁶ represents a hydrogen atom or an alkyl group; and X³ represents a single bond or a divalent organic group.

6. A light sensitive planographic printing plate material comprising a support having a hydrophilic surface, and coated on the hydrophilic surface, the light sensitive composition of any one of items 1 through 5 above.

7. A process of manufacturing a planographic printing plate, wherein the process comprises the step of imagewise exposing the light sensitive planographic printing plate material of item 6 above, employing a laser emitting light with a wavelength of from 350 to 450 nm to record an image.

8. A process of manufacturing a planographic printing plate, wherein the process comprises the step of imagewise exposing the light sensitive planographic printing plate material of item 7 above, employing a laser emitting light with a wavelength of from 470 to 550 nm to record an image.

PREFERRED EMBODIMENTS OF THE INVENTION

The preferred embodiments of the invention will be explained in detail below, but the invention is not limited thereto.

The present invention is characterised in that in a light sensitive composition containing a compound A having a group capable of undergoing radical polymerization, a compound B having a group capable of undergoing cationic polymerization, a photopolymerization initiator C, and a polymer binder D, the photopolymerization initiator C comprises an iron-arene complex and a halogenated alkyl group-containing compound. It has been found that particularly in a light sensitive composition or light sensitive planographic printing plate material which comprises, as a photopolymerization initiator, an iron-arene complex and a halogenated alkyl group-containing compound, cationic polymerization and radical polymerization proceeds simultaneously, resulting in greatly improved sensitivity, and printing durability, and the invention has been made.

The present invention will be further detailed below.

<<Compound Having a Group Capable of Undergoing Radical Polymerization>>

As the compound having a group capable of undergoing radical polymerization in the invention, there are a radical polymerizable monomer, and a polyfunctional monomer or oligomer having two or more of an ethylenic double bond in the molecule generally used in an ultraviolet curable resin composition. The compounds are not specifically limited.

Preferred examples thereof include a monofunctional acrylate such as 2-ethylhexyl acrylate, 2-hydroxypropyl acrylate, glycerol acrylate, tetrahydrofurfuryl acrylate, phenoxyethyl acrylate, nonylphenoxyethyl acrylate, tetrahydrofurfuryl-oxyethyl acrylate, tetrahydrofurfuryloxyhexanorideacrylate, an ester of 1,3-dioxane-ε-caprolactone adduct with acrylic acid, or 1,3-dioxolane acrylate; a methacrylate, itaconate, crotonate or maleate alternative of the above acrylate; a bifunctional acrylate such as ethyleneglycol diacrylate, triethyleneglycol diacrylate, pentaerythritol diacrylate, hydroquinone diacrylate, resorcin diacrylate, hexanediol diacrylate, neopentyl glycol diacrylate, tripropylene glycol diacrylate, hydroxypivalic acid neopentyl glycol diacrylate, neopentyl glycol adipate diacrylate, diacrylate of hydroxypivalic acid neopentyl glycol-ε-caprolactone adduct, 2-(2-hydroxy-1,1-dimethylethyl)-5-hydroxymethyl-5-ethyl-1,3-dioxane diacrylate, tricyclodecanedimethylol acrylate, tricyclodecanedimethylol acrylate-c-caprolactone adduct or 1,6-hexanediol diglycidylether diacrylate; a dimethacrylate, diitaconate, dicrotonate or dimaleate alternative of the above diacrylate; a polyfunctional acrylate such as trimethylolpropane triacrylate, ditrimethylolpropane tetraacrylate, trimethylolethane triacrylate, pentaerythritol triacrylate, pentaerythritol tetraacrylate, dipentaerythritol tetraacrylate, dipentaerythritol pentaacrylate, dipentaerythritol hexacrylate, dipentaerythritol hexacrylate-ε-caprolactone adduct, pyrrogallol triacrylate, propionic acid dipentaerythritol triacrylate, propionic acid dipentaerythritol tetraacrylate or hydroxypivalylaldehyde modified dimethylolpropane triacrylate; a methacrylate, itaconate, crotonate or maleate alternative of the above polyfunctional acrylate.

A prepolymer can be used, and examples of the prepolymer include compounds as described later. The prepolymer with a photopolymerizable property, which is obtained by incorporating acrylic acid or methacrylic in an oligomer with an appropriate molecular weight, can be suitably employed. These prepolymers can be used singly, in combination or as their mixture with the above described monomers and/or oligomers.

Examples of the prepolymer include polyester (meth)acrylate obtained by incorporating (meth)acrylic acid in a polyester of a polybasic acid such as adipic acid, trimellitic acid, maleic acid, phthalic acid, terephthalic acid, hymic acid, malonic acid, succinic acid, glutaric acid, itaconic acid, pyromellitic acid, fumalic acid, pimelic acid, sebatic acid, dodecanic acid or tetrahydrophthalic acid with a polyol such as ethylene glycol, ethylene glycol, diethylene glycol, propylene oxide, 1,4-butane diol, triethylene glycol, tetraethylene glycol, polyethylene glycol, grycerin, trimethylol propane, pentaerythritol, sorbitol, 1,6-hexanediol or 1,2,6-hexanetriol; an epoxyacrylate such as bisphenol A•epichlorhydrin•(meth)acrylic acid or phenol novolak•epichlorhydrin•(meth)acrylic acid obtained by incorporating (meth)acrylic acid in an epoxy resin; an urethaneacrylate such as ethylene glycol•adipic acid•tolylenediisocyanate•2-hydroxyethylacrylate, polyethylene glycol•tolylenediisocyanate•2-hydroxyethylacrylate, hydroxyethylphthalyl methacrylate•xylenediisocyanate, 1,2-polybutadieneglycol•tolylenediisocyanate-2-hydroxyethylacrylate or trimethylolpropane•propylene glycol•tolylenediisocyanate•2-hydroxyethylacrylate, obtained by incorporating (meth)acrylic acid in an urethane resin; a silicone acrylate such as polysiloxane acrylate, or polysiloxane•diisocyanate•2-hydroxyethylacrylate; an alkyd modified acrylate obtained by incorporating a methacroyl group in an oil modified alkyd resin; and a spiran resin acrylate.

The light sensitive composition of the invention may contain a monomer such as a phosphazene monomer, triethylene glycol, an EO modified isocyanuric acid diacrylate, an EO modified isocyanuric acid triacrylate, dimethyloltricyclodecane diacrylate, trimethylolpropane acrylate benzoate, an alkylene glycol acrylate, or a urethane modified acrylate, or an addition polymerizable oligomer or prepolymer having a structural unit derived from the above monomer.

The ethylenic monomer used in the invention is preferably a phosphate compound having at least one (meth)acryloyl group. The phosphate compound is a compound having a (meth)acryloyl group in which at least one hydroxyl group of phosphoric acid is esterified, and the phosphate compound is not limited as long as it has a (meth)acryloyl group.

In the invention, a reaction product of a polyhydric alcohol having a tertiary amino group in the molecule, a diisocyanate and a compound having a hydroxyl group and an addition polymerizable ethylenically double bond in the molecule is preferably used. Examples of the polyhydric alcohol having a tertiary amino group in the molecule include triethanolamine, N-methyldiethanolamine, N-ethyldiethanolamine, N-ethyldiethanolamine, N-n-butyldiethanolamine, N-tert-butyldiethanolamine, N,N-di(hydroxyethyl)aniline, N,N,N',N'-tetra-2-hydroxypropylethylenediamine, p-tolyldiethanolamine, N,N,N',N'-tetra-2-hydroxyethylethylenediamine, N,N-bis(2-hydroxypropyl)aniline, allyldiethanolamine, 3-dimethylamino-1,2-propane diol, 3-diethylamino-1,2-propane diol, N,N-di(n-propylamino)-2,3-propane diol, N,N-di(iso-propylamino)-2,3-propane diol, and 3-(N-methyl-N-benzylamino)-1,2-propane diol, but the invention is not specifically limited thereto.

Examples of the diisocyanate include butane-1,4-diisocyanate, hexane-1,6-diisocyanate, 2-methylpentane-1,5-diisocyanate, octane-1,8-diisocyanate, 1,3-diisocyanatomethylcyclohexanone, 2,2,4-trimethylhexane-1,6-diisocyanate, isophorone diisocyanate, 1,2-phenylene diisocyanate, 1,3-phenylene diisocyanate, 1,4-phenylene diisocyanate, tolylene-2,4-diisocyanate, tolylene-2,5-diisocyanate, tolylene-2,6-diisocyanate, 1,3-di(isocyanatomethyl)benzene, and 1,3-bis(1-isocyanato-1-methylethyl)benzene, but the invention is not specifically limited thereto. Examples of the compound having a hydroxyl group and an addition polymerizable ethylenically double bond in the molecule include the-following compounds MH-1 through MH-13, but the invention is not specifically limited thereto. Preferred examples thereof include 2-hydroxyethyl methacrylate, 2-hydroxyethyl acrylate, 4-hydroxybutyl acrylate, 2-hydroxypropylene-1,3-dimethacrylate, and 2-hydroxypropylene-1-methacrylate-3-acrylate.

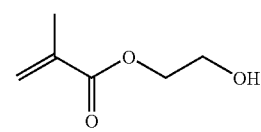

MH-1

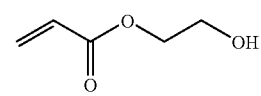

MH-2

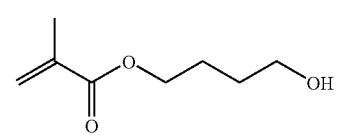

MH-3

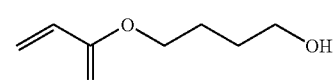

MH-4

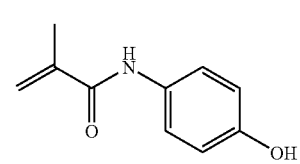

MH-5

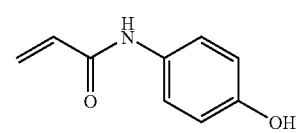

MH-6

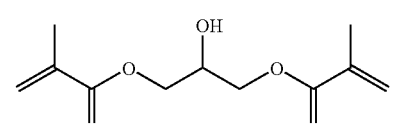

MH-7

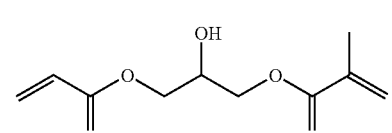

MH-8

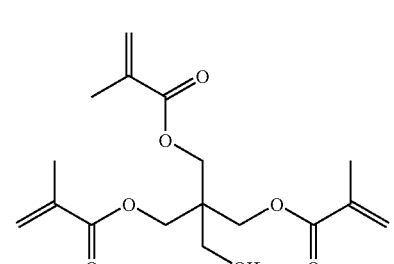

MH-9

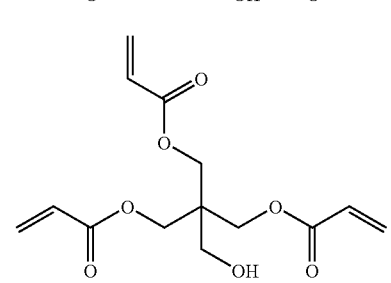

MH-10

-continued

MH-11: [structure: methacrylate with ethylene glycol ether, terminal OH]

MH-12: [structure: methacrylate with propylene glycol, terminal OH]

MH-13: [structure: acrylate with triethylene glycol ether, terminal OH]

The reaction product above can be synthesized according to the same method as a conventional method in which a urethaneacrylate compound is ordinarily synthesized employing an ordinary diol, a diisocyanate and an acrylate having a hydroxyl group.

Besides the above compounds, compounds disclosed in Japanese Patent O.P.I. Publication Nos. 58-212994, 61-6649, 62-46688, 62-48589, 62-173295, 62-187092, 63-67189, and 1-244891, compounds described on pages 286 to 294 of "11290 Chemical Compounds" edited by Kagakukogyo Nipposha, and compounds described on pages 11 to 65 of "UV•EB Koka Handbook (Materials)" edited by Kobunshi Kankokai can be suitably used. Of these compounds, compounds having two or more acryl or methacryl groups in the molecule are preferable, and those having a molecular weight of not more than 10,000, and preferably not more than 5,000 are more preferable.

The content of the compound having a group capable of undergoing radical polymerization in the light sensitive composition is preferably from 10 to 70% by weight, and more preferably from 20 to 60% by weight, based on the solid component of the composition.

<<Compound Having a Group Capable of Undergoing Cationic Polymerization>>

In the invention, as the group capable of undergoing cationic polymerization, there are a group having a cyclic ether structure such as an oxirane ring, an oxetane ring or a dioxolane ring; and a group having an unsaturated ether structure such as vinyl ether or allyl ether.

Preferred is a compound having an oxirane ring, an oxatane ring or a dioxalane ring, as the group capable of undergoing cationic polymerization, and a group capable of undergoing radical polymerization. A compound represented by formula (A) above is especially preferred, which has an acryloyl group or a methacryloyl group in the molecule. A compound represented by formula (B) or (C) above is also especially preferred.

Examples of these compounds will be listed below, but the invention is not limited thereto.

M101, M102, M103, M104, M105, M106, M107, M108, M109: [structures of epoxycyclohexane-based methacrylate/acrylate compounds]

-continued
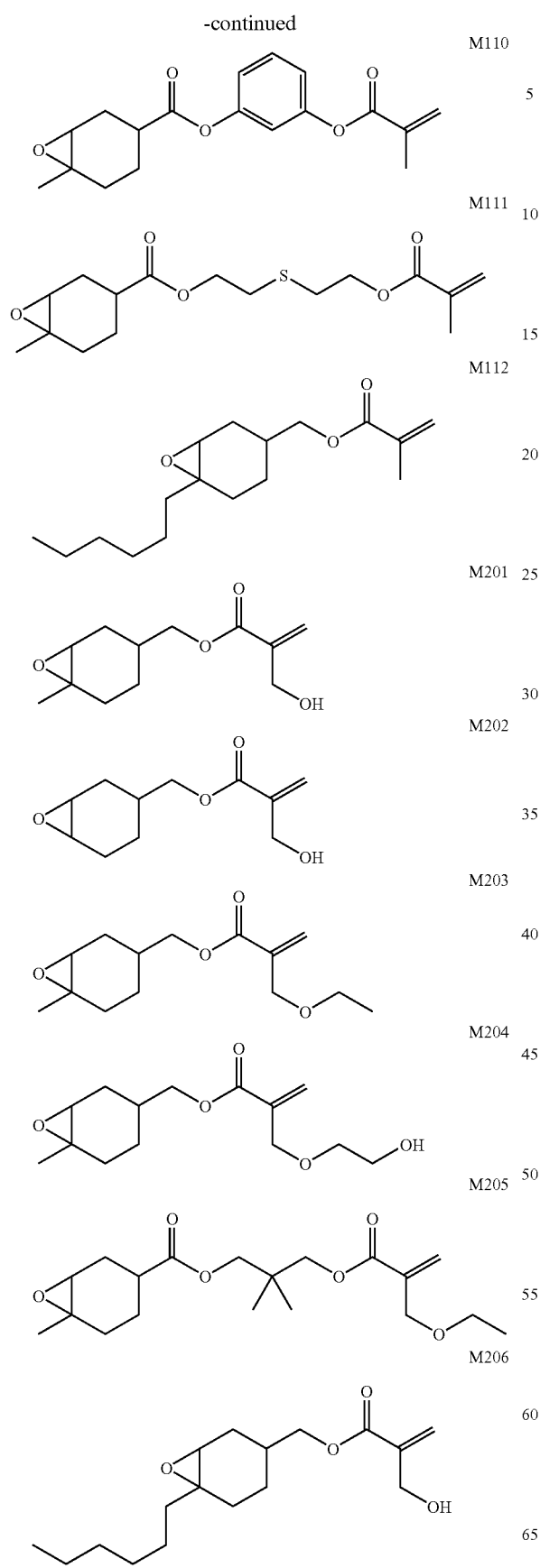
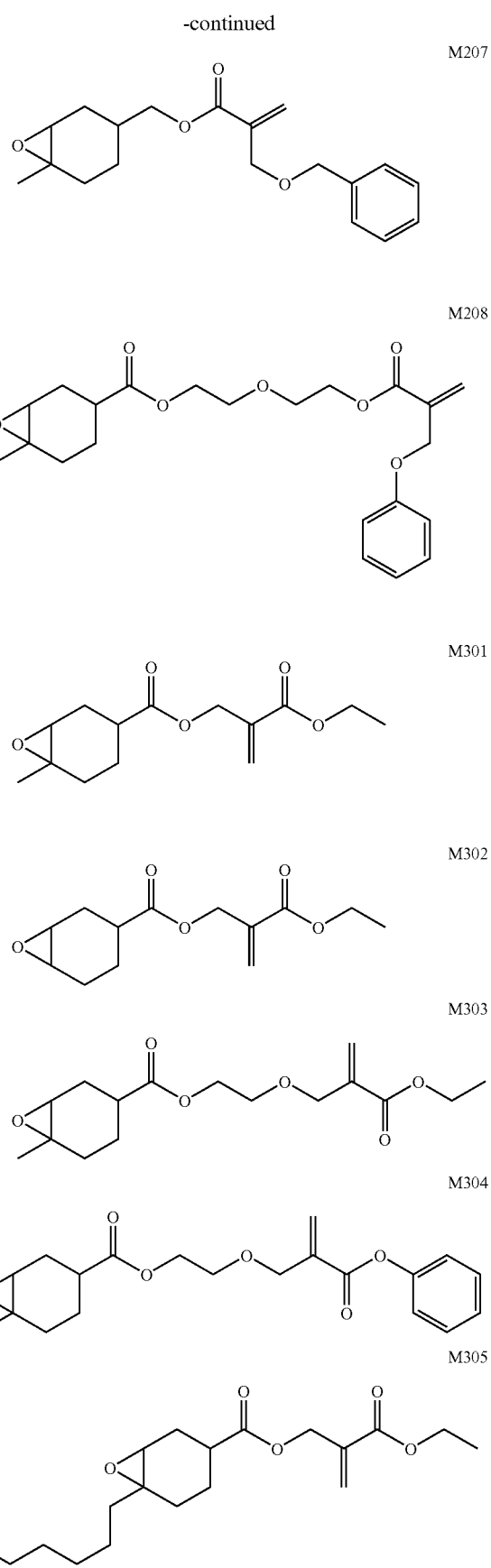

-continued

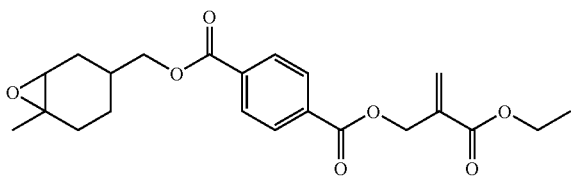

M306

As the compound having a group capable of undergoing cationic polymerization in the invention, there is an oxetane compound having an oxetane ring. In the invention, as the oxetane compound, an oxetane compound having 1 to 4 oxetane rings is preferably employed. An oxetane compound having five or more oxetane rings provides a composition with less fluidity, which may not be applied to printing. Any oxetane compound can be used, as long as it is an oxetane compound having 1 to 4 oxetane rings.

As one example of an oxetane compound having one oxetane ring, an oxetane compound represented by the following formula (1) is cited.

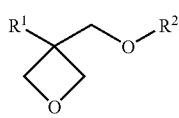

Formula (1)

In formula (1), $R^1$ represents a hydrogen atom, an alkyl group having from 1 to 6 carbon atoms such as a methyl group, an ethyl group, a propyl group, a butyl group, etc.; a fluoroalkyl group having from 1 to 6 carbon atoms; an allyl group; an aryl group; a furyl group; or a thienyl group; and $R^2$ represents an alkyl group having from 1 to 6 carbon atoms such as a methyl group, an ethyl group, a propyl group, a butyl group, etc.; an alkenyl group having from 2 to 6 carbon atoms such as a 1-propenyl group, a 2-propenyl group, a 2-methyl-1-propenyl group, a 2-methyl-2-propenyl group, a 1-butenyl group, a 2-butenyl group, a 3-butenyl group, etc.), an aromatic ring-containing group such as a phenyl group, a benzyl group, a fluorobenzyl group, a methoxybenzyl group; a phenoxyethyl group, etc.; an alkylcarbonyl group having from 2 to 6 carbon atoms such as an ethylcarbonyl group, a propylcarbonyl group, a butylcarbonyl group, etc.; an alkoxycarbonyl group having from 2 to 6 carbon carbons such as an ethoxycarbonyl group, a propoxycarbonyl group, a butoxycarbonyl group, etc.; an N-alkylcarbamoyl group having from 2 to 6 carbon atoms such as an ethylcarbamoyl group, a propylcarbamoyl group, a butylcarbamoyl group, a pentylcarbamoyl, etc.

As one example of an oxetane compound having two oxetane rings, an oxetane compound represented by the following formula (2) is cited.

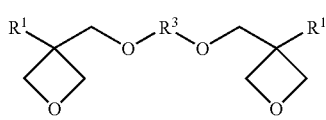

Formula (2)

In formula (2), $R^1$ represents the same group as those denoted in $R_1$ in formula 1; and $R^3$ represents a straight chained or branched alkylene group such as an ethylene group, a propylene group, a butylene group, etc.; a straight chained or branched polyalkyleneoxy group such as a poly(ethyleneoxy) group, a poly(propyleneoxy group, etc.; a straight chained or branched unsaturated divalent hydrocarbon group such a propenylene group, a methylpropenylene group, a butenylene group, etc.; an alkylene group containing a carbonyl group; an alkylene group containing a carbonyloxy group; or an alkylene group containing a carbamoyl group. $R^3$ also represents a divalent group selected from groups represented by the following formulae (3), (4), and (5).

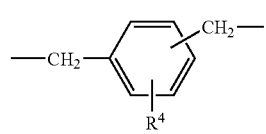

Formula (3)

In formula (3), $R^4$ represents a hydrogen atom, an alkyl group having from 1 to 4 carbon atoms such as a methyl group, an ethyl group, a propyl group, a butyl group, etc.; an alkoxy group having from 1 to 4 carbon atoms such as a methoxy group, an ethoxy group, a propoxy group, a butoxy group, etc.; a halogen atom such as a chlorine atom, a bromine atom, etc.; a nitro group; a cyano group; a mercapto group; a lower alkylcarboxy group; carboxyl group; or a carbamoyl group.

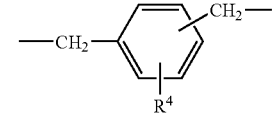

Formula (4)

In formula (4), $R^5$ represents an oxygen atom, a sulfur atom, a methylene group, —NH—, —SO—, —SO$_2$—, —(CF$_3$)$_2$—, or —C(CH$_3$)$_2$—.

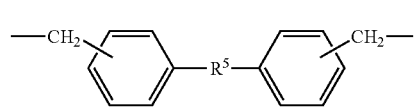

Formula (5)

In formula (11), $R^6$ represents an alkyl group having from 1 to 4 carbon atoms such as a methyl group, an ethyl group, a propyl group, a butyl group, etc., or an aryl group; "n" represents an integer of from 0 to 2000; and $R^7$ represents an alkyl group having from 1 to 4 carbon atoms such as a methyl group, an ethyl group, a propyl group, a butyl group, etc, or an aryl group, or a group represented by the following formula (6).

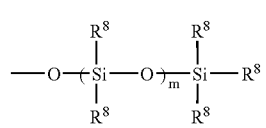

Formula (6)

In formula (6), $R^8$ represents an alkyl group having from 1 to 4-carbon atoms such as a methyl group, an ethyl group, a propyl group, a butyl group, etc., or an aryl group; and m represents an integer of from 0 to 100.

Examples of a compound having two oxetane rings include the following exemplified compounds 1 and 2.

Exemplified compound 1

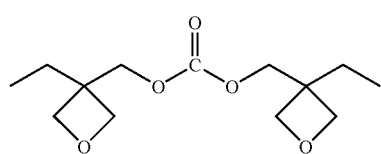

Exemplified compound 2

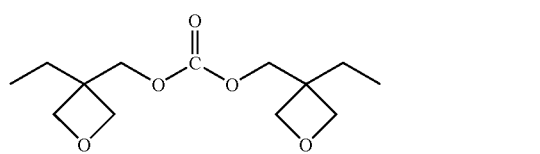

Exemplified compound 1 is a compound in which in formula (2), $R^1$ is an ethyl group, and $R^3$ is a carbonyl group. Exemplified compound 2 is a compound in which in formula (2), $R^1$ is an ethyl group, and $R^3$ is a group in which in formula (5), $R^6$ is a methyl group, $R^7$ is a methyl group, and n is 1.

As another example of an oxetane compound having two oxetane rings, an oxetane compound represented by the following formula (7) is cited.

Formula (7)

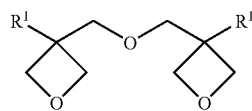

As an example of an oxetane compound having three or four oxetane rings, an oxetane compound represented by the following formula (8) is cited.

Formula (8)

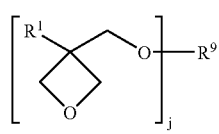

In formula (8), $R^1$ is the same as those denoted in $R^1$ of formula (1); and $R^9$ represents a branched alkylene group having 1 to 12 carbon atoms such as a group represented by A, B, or C below, a branched polyalkyleneoxy group such as a group represented by D below, or a branched alkylene group containing a silylether group such as a group represented by E below. "j" represents an integer of 3 or 4.

A

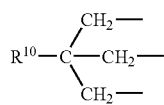

-continued

B

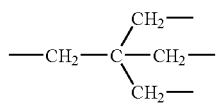

C

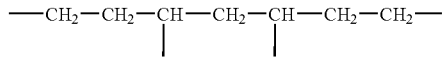

D

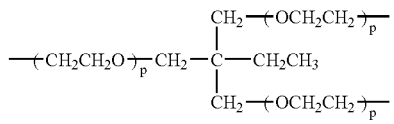

E

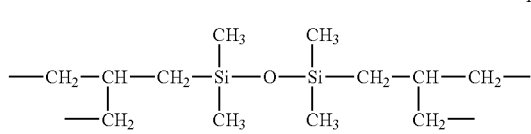

In formula A, $R^{10}$ represents a lower alkyl group such as a methyl group, an ethyl group, or a propyl group. In formula D, p represents an integer of from 1 to 10.

As an example of an oxetane compound having three to four oxetane rings, an exemplified compound 3 is cited.

Exemplified compound 3

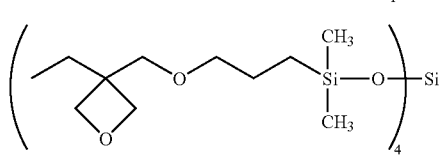

As a compound having 1 to 4 oxetane rings other than the compounds described above, a compound represented by the following formula (9) is cited.

Formula (9)

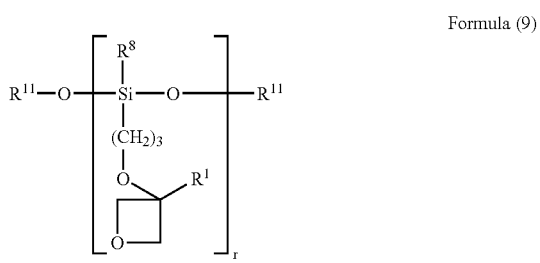

In formula (9), $R^8$ is the same as those denoted in $R^8$ of formula (6); $R^{11}$ represents an alkyl group having 1 to 4 carbon atoms such as a methyl group, an ethyl group, or a propyl group, or a trialkylsilyl group; r represents an integer of from 1 to 4. R1 is the same as those denoted in formula (1) above.

The preferred oxetane compounds used in the invention are exemplified compounds as shown below.

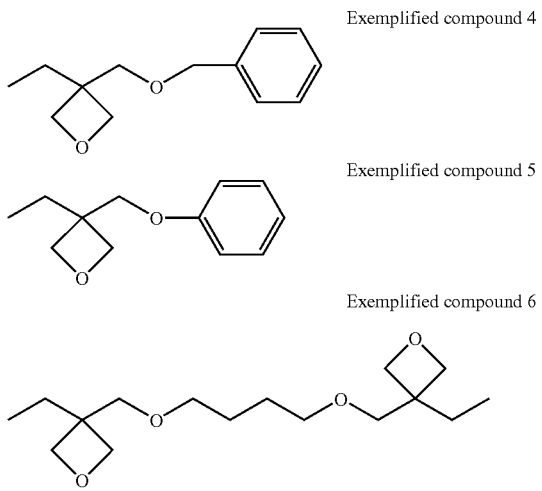

Exemplified compound 4

Exemplified compound 5

Exemplified compound 6

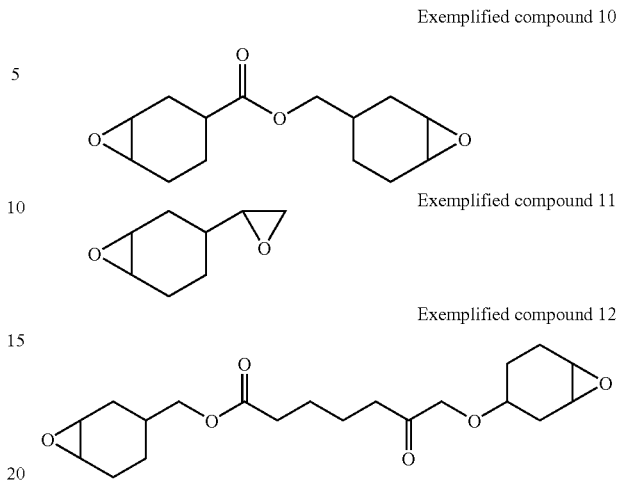

Exemplified compound 10

Exemplified compound 11

Exemplified compound 12

Besides the above-described oxetane compounds, polymeric oxetane compounds having 1 to 4 oxetane rings with a molecular weight of 1000 to 5000 can be used. Examples thereof include the following compounds.

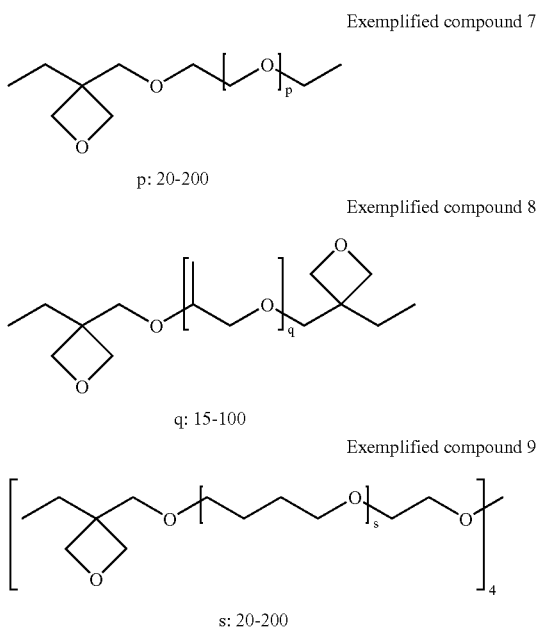

Exemplified compound 7 p: 20-200

Exemplified compound 8 q: 15-100

Exemplified compound 9 s: 20-200

In the above, p is from 20 to 200.

As another compound having a group capable of undergoing cationic polymerization, there are a compound having an epoxy group and a compound having a vinyl ether group. As the compound having an epoxy group, various compounds can be used. Examples of an epoxy compound having one epoxy group include phenyl glycidyl ether and butyl glycidyl ether. Examples of an epoxy compound having two or more epoxy groups include hexane diol diglycidyl ether, tetraethylene glycol diglycidyl ether, trimethylolpropane triglycidyl ether, bisphenol A diglycidyl ether, and epoxidated novolak resin. In the invention, an alicyclic epoxy compound is especially preferred. Examples thereof will be listed below.

A light sensitive composition containing the epoxy compound and the oxetane compound having one to four oxetane rings can further increase the curing speed of the composition. The epoxy compound content of the light sensitive composition is preferably from 5 to 95 parts by weight, based on 100 parts by weight of the total content of the epoxy compound and the oxetane compound having one to four oxetane rings.

As the compound having a vinyl ether group, various compounds can be used. Examples of a compound having one vinyl ether group include hydroxyethyl vinyl ether, hydroxybutyl vinyl ether, propenyl ether propylene carbonate, and cyclohexyl vinyl ether. Examples of a compound having two or more vinyl ether groups include cyclohexane dimethanol divinyl ether, triethylene glycol divinyl ether, and novolak resin divinyl ether.

A light sensitive composition containing the compound having a vinyl ether group and the oxetane compound having one to four oxetane rings can further increase the curing speed.

The content of the compound having a vinyl ether group in the light sensitive composition is preferably from 5 to 95 parts by weight, based on 100 parts by weight of the total content of the compound having a vinyl ether group and the oxetane compound having one to four oxetane rings.

The content of the compound B) capable of undergoing cationic polymerization in the light sensitive composition is preferably from 2 to 50% by weight, and more preferably from 5 to 30% by weight, based on the solid component of the composition.

<<Photopolymerization Initiator>>

The chemical structure of an iron-arene complex in the invention is represented by formula (D) below: Formula (D)

[A-Fe—B]$^+$X$^-$ wherein A represents a cyclopentadienyl group or an alkyl-substituted cyclopentadienyl group; B represents arene; and X$^-$ represents an anionic group.

Examples of the arene include benzene, toluene, xylene, cumene, naphthalene, 1-methylnaphthalene, 2-methylnaphthalene, and fluorene. Examples of the X$^-$ include $PF_6^-$, $BF_4^-$, $SbF_6^-$, $AlF_4^-$, and $CF_3SO_3^-$. Preferred examples of the iron-arene complex will be listed below, but the invention is not limited thereto.

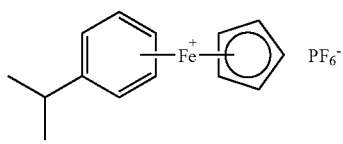

IA-1

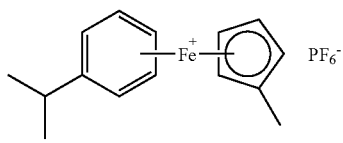

IA-2

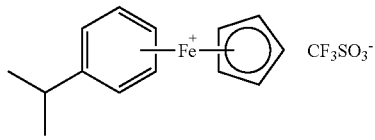

IA-3

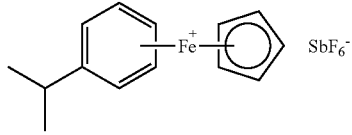

IA-4

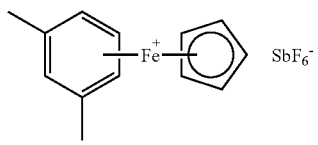

IA-5

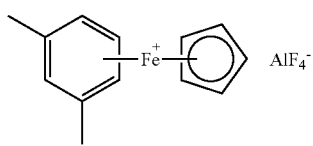

IA-6

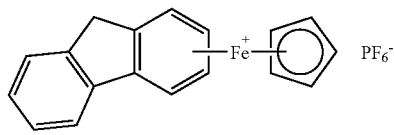

IA-7

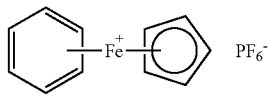

IA-8

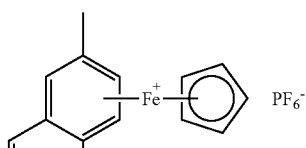

IA-9

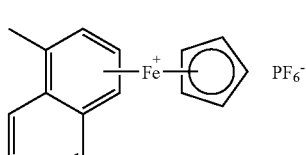

IA-10

A halogenated alkyl group-containing compound in the invention is preferably a polyhalide compound. Examples of the polyhalide compound include a polyhalogen-containing acetophenone such as tribromoacetophenone, trichloroacetophenone, o-nitro-tribromoacetophenone, p-nitro-tribromoacetophenone, m-nitro-tribromoacetophenone, m-bromo-tribromoacetophenone, or p-bromo-tribromoacetophenone; a polyhalogen-containing sulfoxide such as bis(tribromomethyl) sulfoxide, dibromomethyl-tribromomethyl sulfoxide; a polyhalogen-containing sulfone such as bis(tribromomethyl) sulfone, trichloromethyl-phenylsulfone, tribromomethyl-phenylsulfone, trichloromethyl-p-chlorophenylsulfone, tribromomethyl-p-nitrophenylsulfone, 2-trichloromethyl-benzothiazolesulfone, or 2,4-dichlorophenyl-trichloromethylsulfone; a polyhalogen-containing pyrron compound; a polyhalogen-containing triazine compound; and a polyhalogen-containing oxadiazole compound.

Preferred examples of the polyhalogen compound will be listed below, but the invention is not limited thereto.

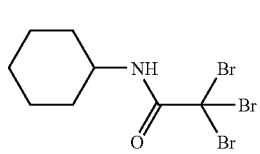

BR1

BR2

-continued
BR3
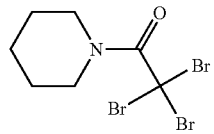
BR4
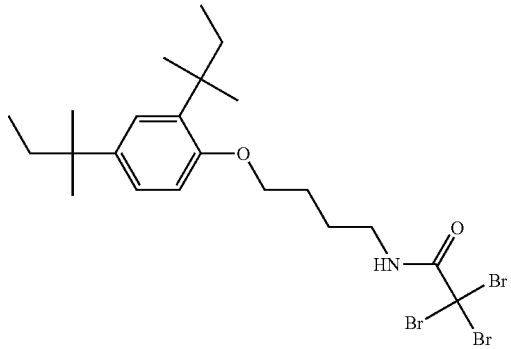
BR5
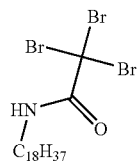
BR6
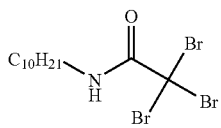
BR7
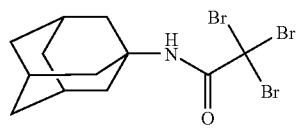
BR8
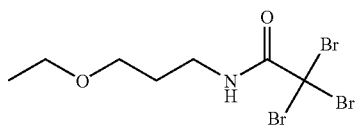
BR9
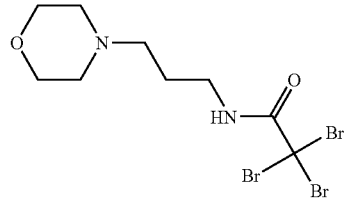
BR10
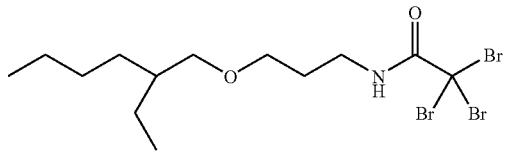
BR11
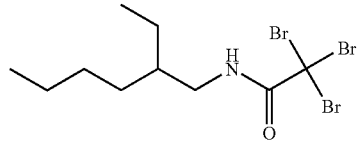
BR12
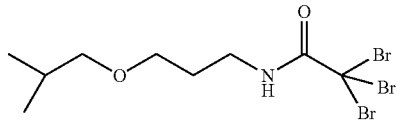
BR13
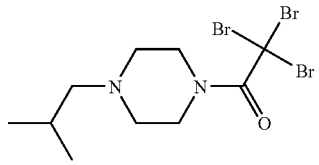
BR14
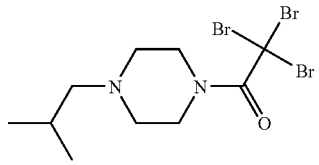
BR15
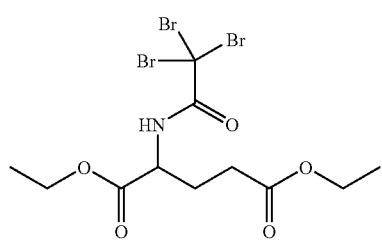
BR16
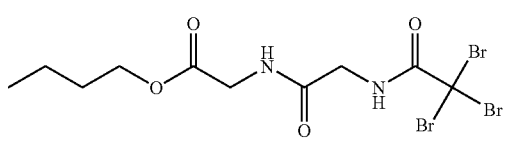

-continued
BR17 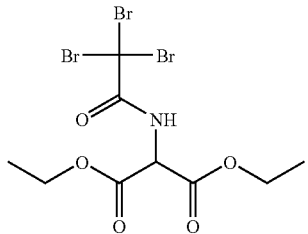 BR18 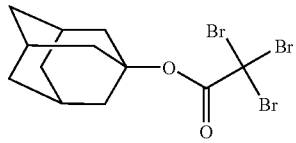
BR19 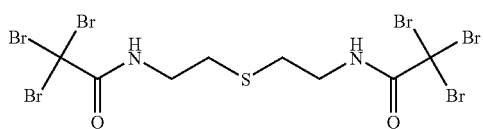 BR20 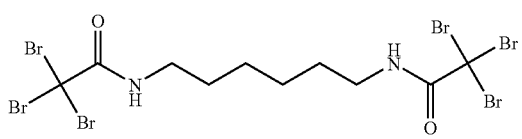
BR21 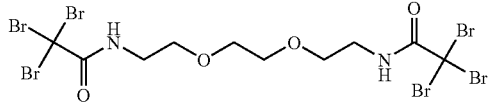 BR22 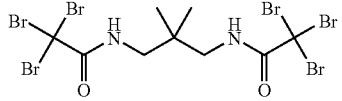
BR23 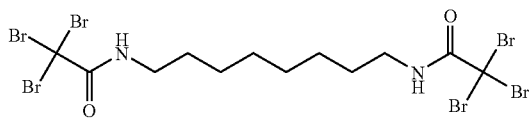 BR24 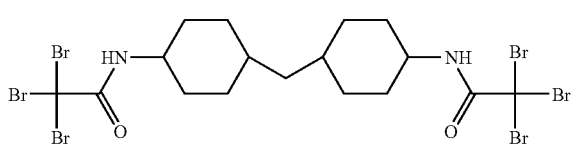
BR25 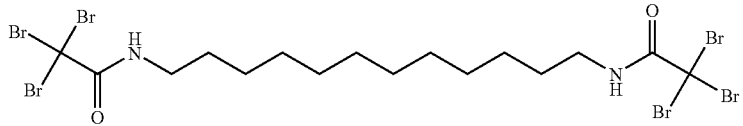
BR26 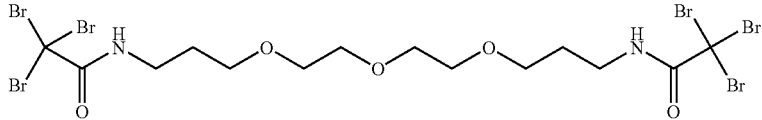
BR27
BR28 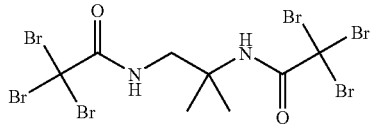 BR29 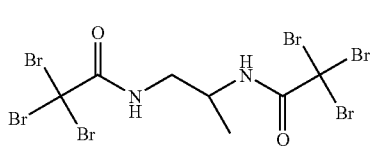
BR30 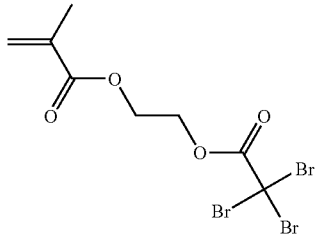 BR31 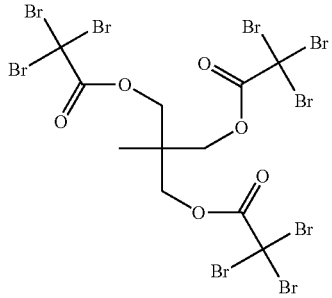

-continued
BR32
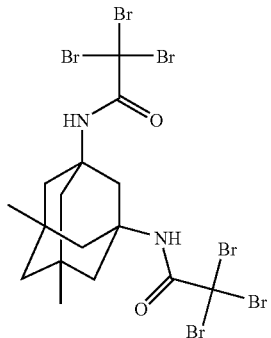
BR33
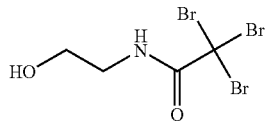
BR34
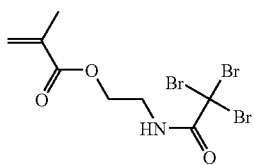
BR35
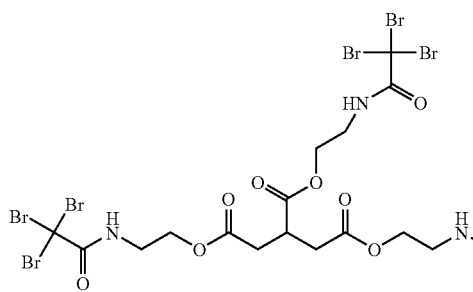
BR36
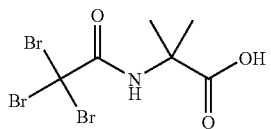
BR37
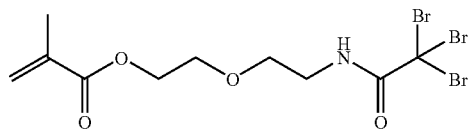
BR38
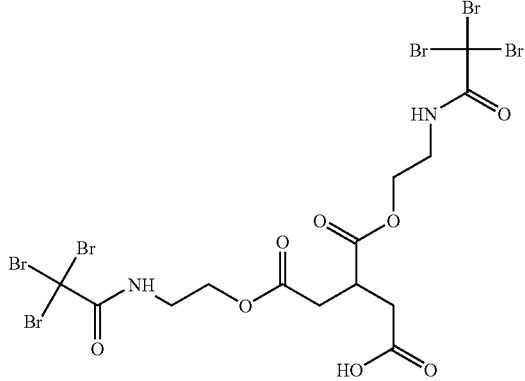
BR39
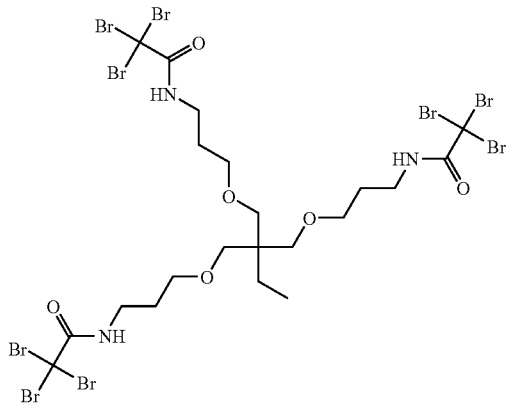
BR40
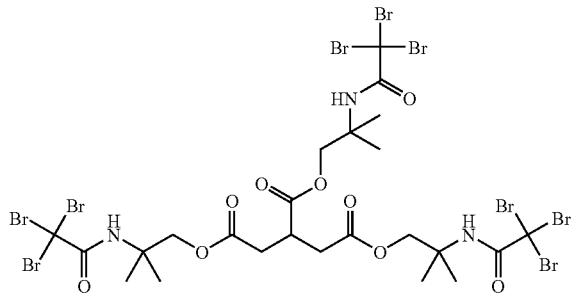

-continued
BR41
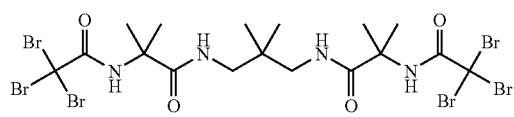
BR42
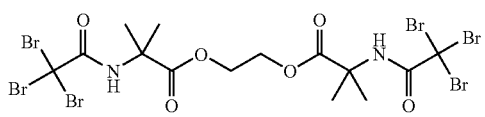
BR43
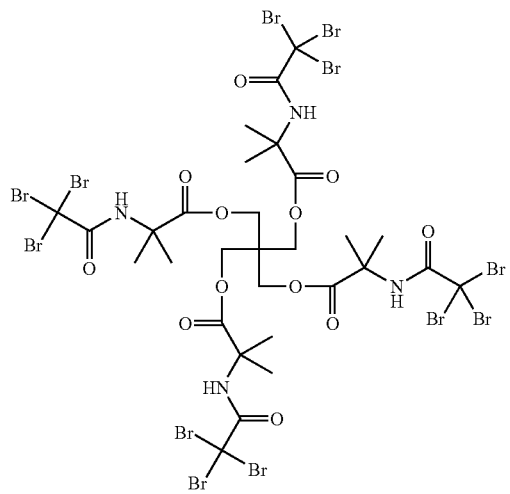
BR44
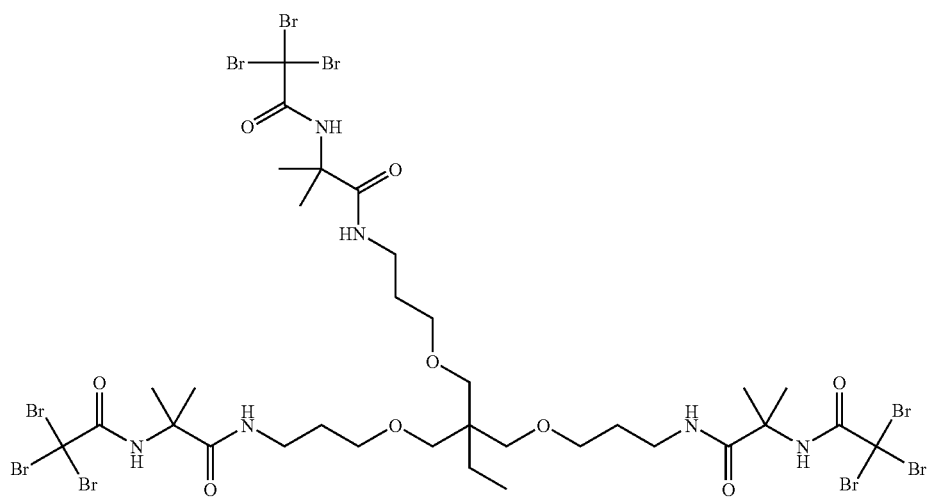
BR45
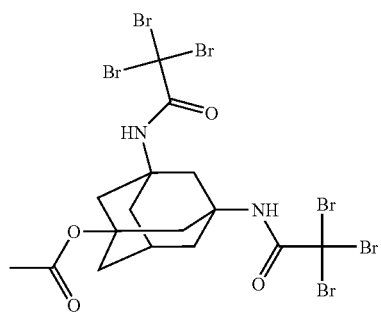
BR46
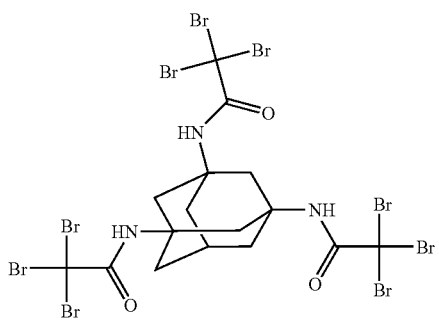
BR47
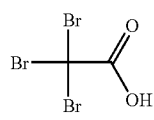
BR48
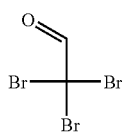

-continued
BR49 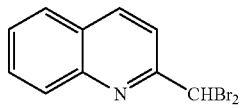 BR50 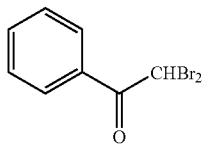
CL1 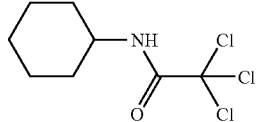 CL2 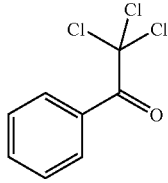
CL3 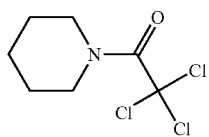 CL4 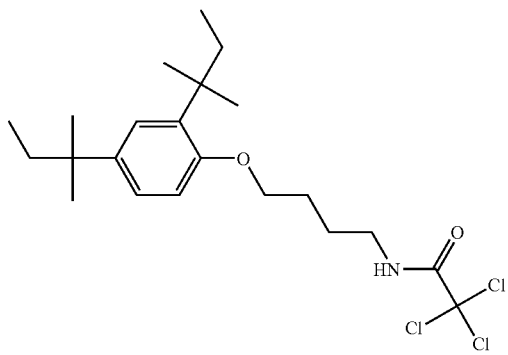
CL5 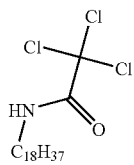 CL6 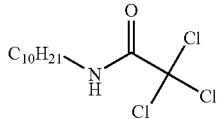
CL7 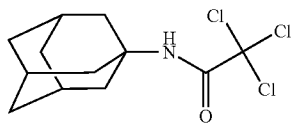 CL8 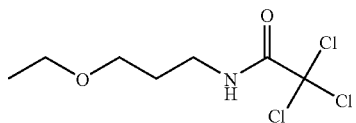
CL9 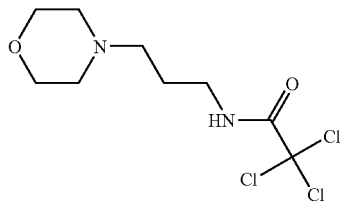 CL10 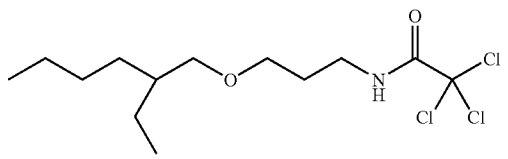
CL11 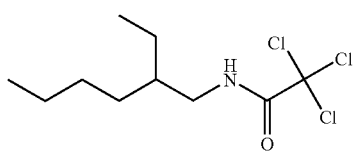 CL12 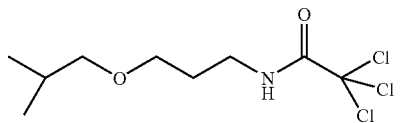
CL13 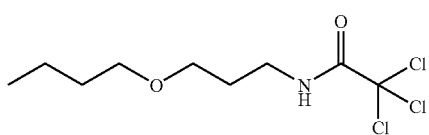 CL14 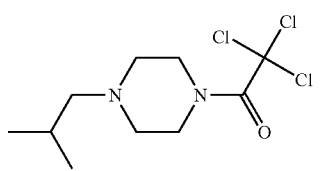

-continued
CL15
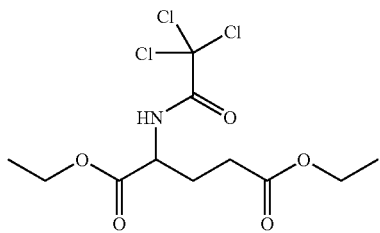
CL16
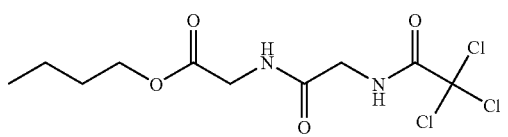
CL17
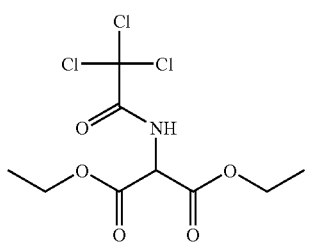
CL18
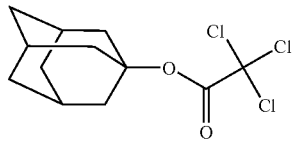
CL19
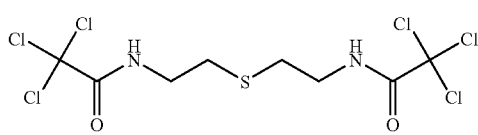
CL20
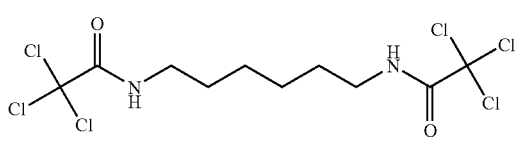
CL21
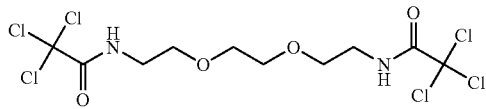
CL22
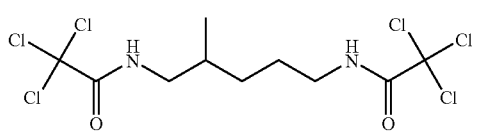
CL23
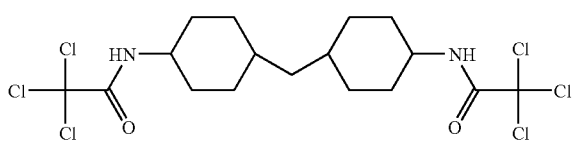
CL24
CL25
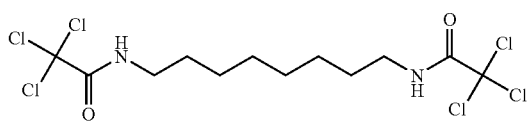
CL26
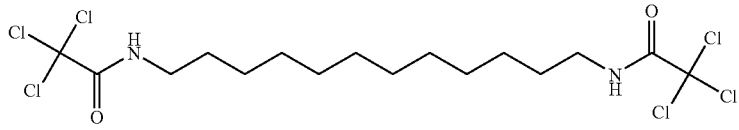
CL27
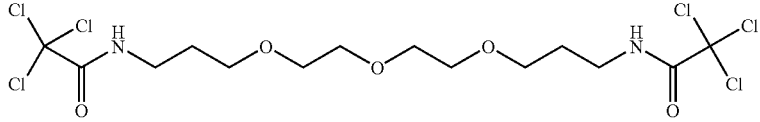
CL28
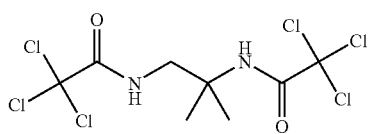
CL29
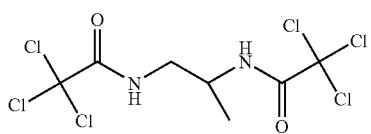

-continued
CL30 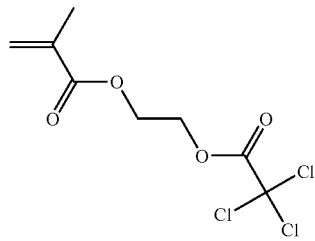 CL31 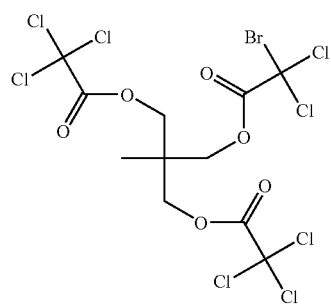
CL32 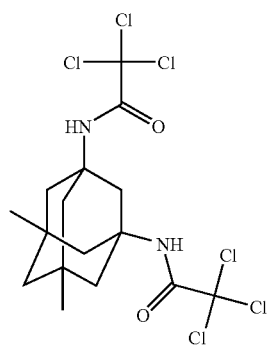 CL33 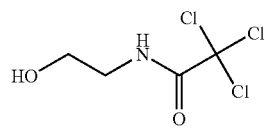
CL34 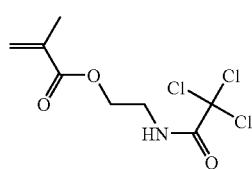 CL35 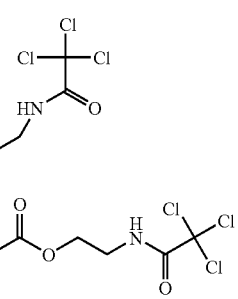
CL36 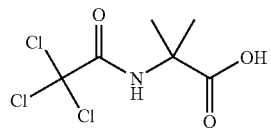 CL37 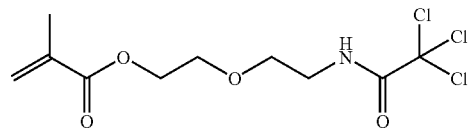
CL38 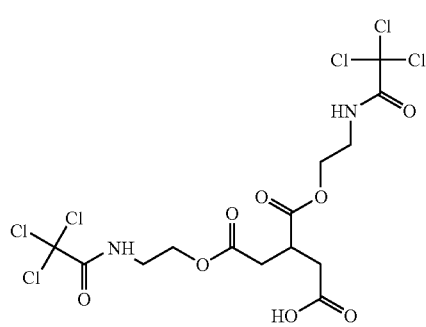 CL39 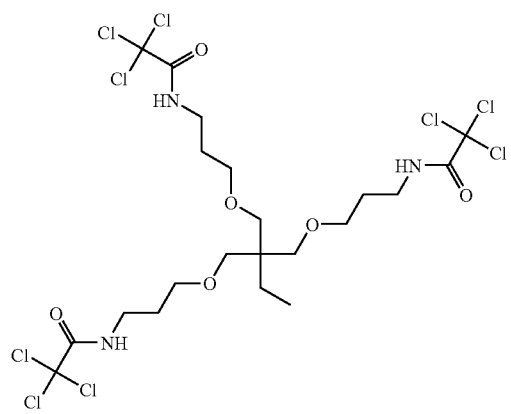

-continued
CL40
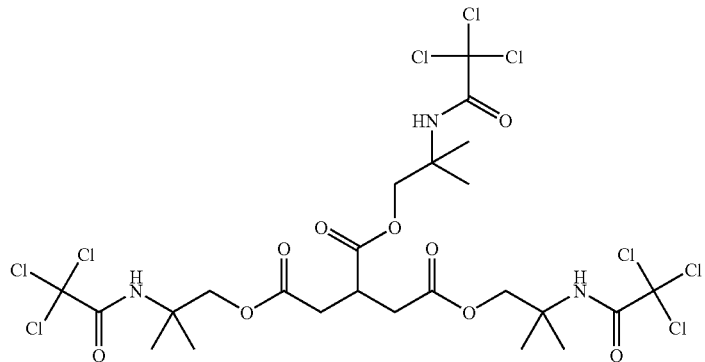
CL41
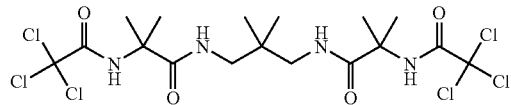
CL42
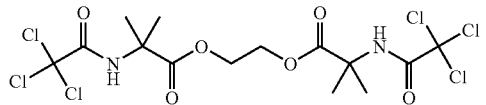
CL43
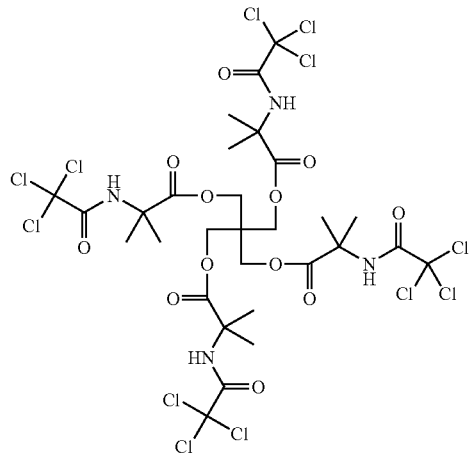
CL44
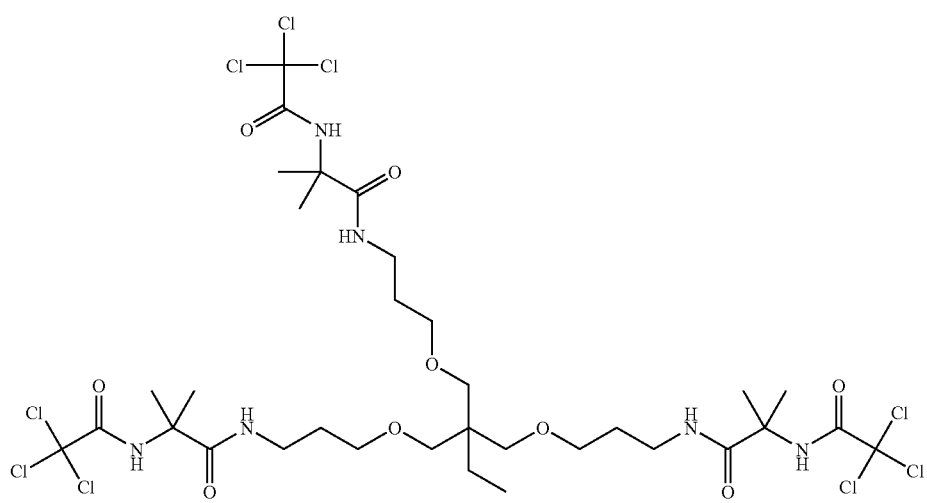

-continued
| | |
|---|---|
| CL45 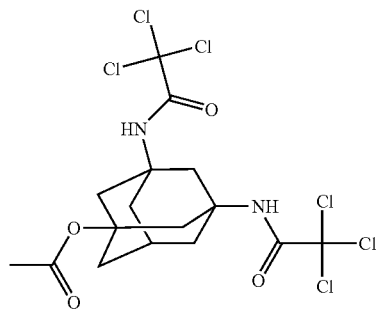 | CL46 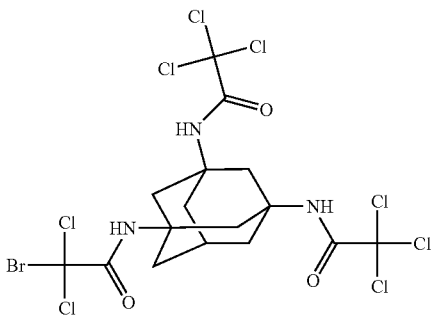 |
| CL47 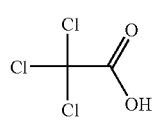 | CL48 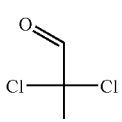 |
| CL49 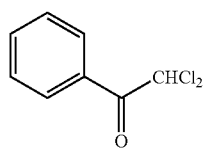 | CL50 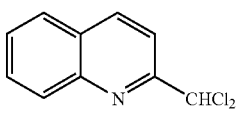 |
| TZ-1 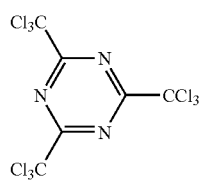 | TZ-2 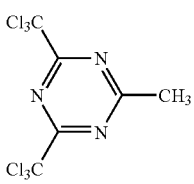 |
| TZ-3 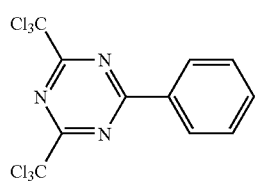 | TZ-4 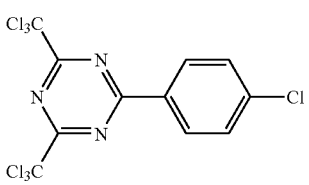 |
| TZ-5 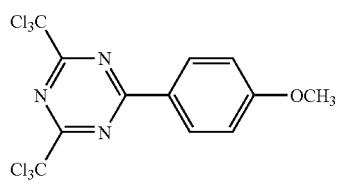 | TZ-6 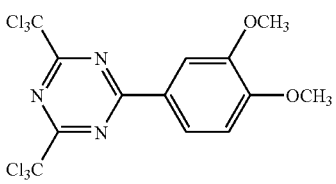 |
| TZ-7 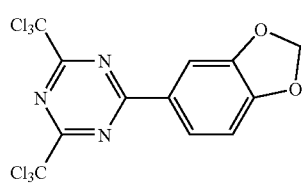 | TZ-8 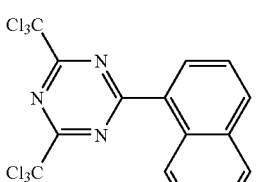 |
| TZ-9 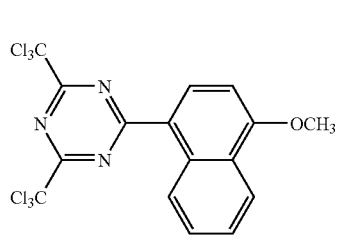 | TZ-10 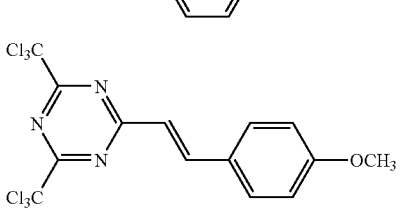 |

-continued

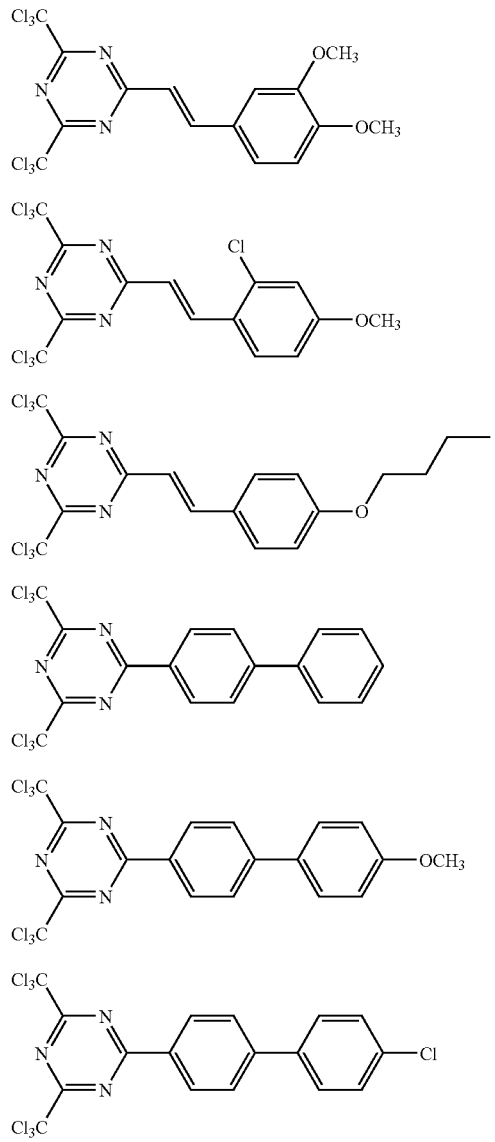
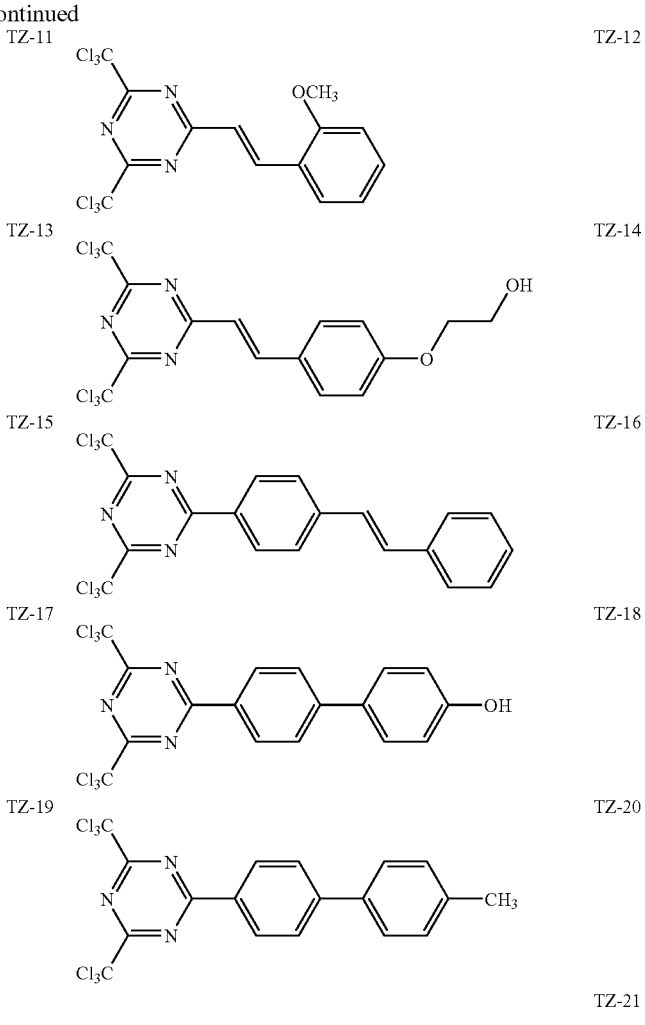

The content of the photopolymerization initiator C) in the light sensitive composition is preferably from 1 to 30% by weight, and more preferably from 2 to 15% by weight, based on the solid component of the composition. The epoxy compound content ratio (by weight) of the iron-arene complex to the halogenated alkyl group-containing compound in the light sensitive composition is preferably from 5:95 to 95:5, and more preferably from 20:80 to 80:20.

<<Polymer Binder>>

Next, a polymer binder will be explained.

As the polymer binder in the invention can be used a polyacrylate resin, a polyvinylbutyral resin, a polyurethane resin, a polyamide resin, a polyester resin, an epoxy resin, a phenol resin, a polycarbonate resin, a polyvinyl butyral resin, a polyvinyl formal resin, a shellac resin, or another natural resin. These resins can be used as an admixture of two or more thereof.

The polymer binder used in the invention is preferably a vinyl copolymer obtained by copolymerization of an acryl monomer, and more preferably a copolymer containing (a) a carboxyl group-containing monomer unit and (b) an alkyl methacrylate or alkyl acrylate unit as the copolymerization component.

Examples of the carboxyl group-containing monomer include an α,β-unsaturated carboxylic acid, for example, acrylic acid, methacrylic acid, maleic acid, maleic anhydride, itaconic acid, itaconic anhydride or a carboxylic acid such as a half ester of phthalic acid with 2-hydroxymethacrylic acid.

Examples of the alkyl methacrylate or alkyl acrylate include an unsubstituted alkyl ester such as methylmethacrylate, ethylmethacrylate, propylmethacrylate, butylmethacrylate, amylmethacrylate, hexylmethacrylate, heptylmethacrylate, octylmethacrylate, nonylmethacrylate, decylmethacrylate, undecylmethacrylate, dodecylmethacrylate, methylacrylate, ethylacrylate, propylacrylate, butylacrylate, amylacrylate, hexylacrylate, heptylacrylate, octylacrylate, nonylacrylate, decylacrylate, undecylacrylate, or dodecylacrylate; a cyclic alkyl ester such as cyclohexyl methacrylate or cyclohexyl acrylate; and a substituted alkyl ester such as benzyl methacrylate, 2-chloroethyl methacrylate, N,N-dimethylaminoethyl methacrylate, glycidyl methacrylate, benzyl acrylate, 2-chloroethyl acrylate, N,N-dimethylaminoethyl acrylate or glycidyl acrylate.

The polymer binder in the invention can further contain, as another monomer unit, a monomer unit derived from the monomer described in the following items (1) through (14):

(1) A monomer having an aromatic hydroxy group, for example, o-, (p- or m-) hydroxystyrene, or o-, (p- or m-) hydroxyphenylacrylate;

(2) A monomer having an aliphatic hydroxy group, for example, 2-hydroxyethyl acrylate, 2-hydroxyethyl methacrylate, N-methylolacrylamide, N-methylolmethacrylamide, 4-hydroxybutyl acrylate, 4-hydroxybutyl methacrylate, 5-hydroxypentyl acrylate, 5-hydroxypentyl methacrylate, 6-hydroxyhexyl acrylate, 6-hydroxyhexyl methacrylate, N-(2-hydroxyethyl)acrylamide, N-(2-hydroxyethyl)methacrylamide, or hydroxyethyl vinyl ether;

(3) A monomer having an aminosulfonyl group, for example, m- or p-aminosulfonylphenyl methacrylate, m- or p-aminosulfonylphenyl acrylate, N-(p-aminosulfonylphenyl) methacrylamide, or N-(p-aminosulfonylphenyl)acrylamide;

(4) A monomer having a sulfonamido group, for example, N-(p-toluenesulfonyl)acrylamide, or N-(p-toluenesulfonyl)methacrylamide;

(5) An acrylamide or methacrylamide, for example, acrylamide, methacrylamide, N-ethylacrylamide, N-hexylacrylamide, N-cyclohexylacrylamide, N-phenylacrylamide, N-nitrophenylacrylamide, N-ethyl-N-phenylacrylamide, N-4-hydroxyphenylacrylamide, or N-4-hydroxyphenylmethacrylamide;

(6) A monomer having a fluorinated alkyl group, for example, trifluoromethyl acrylate, trifluoromethyl methacrylate, tetrafluoropropyl methacrylate, hexafluoropropyl methacrylate, octafluoropentyl acrylate, octafluoropentyl methacrylate, heptadecafluorodecyl methacrylate, heptadecafluorodecyl methacrylate, or N-butyl-N-(2-acryloxyethyl) heptadecafluorooctylsulfonamide;

(7) A vinyl ether, for example, ethyl vinyl ether, 2-chloroethyl vinyl ether, propyl vinyl ether, butyl vinyl ether, octyl vinyl ether, or phenyl vinyl ether;

(8) A vinyl ester, for example, vinyl acetate, vinyl chroloacetate, vinyl butyrate, or vinyl benzoate;

(9) A styrene, for example, styrene, methylstyrene, or chloromethystyrene;

(10) A vinyl ketone, for example, methyl vinyl ketone, ethyl vinyl ketone, propyl vinyl ketone, or phenyl vinyl ketone;

(11) An olefin, for example, ethylene, propylene, isobutylene, butadiene, or isoprene;

(12) N-vinylpyrrolidone, N-vinylcarbazole, or N-vinylpyridine,

(13) A monomer having a cyano group, for example, acrylonitrile, methacrylonitrile, 2-pentenenitrile, 2-methyl-3-butene nitrile, 2-cyanoethyl acrylate, or o-, m- or p-cyanostyrene;

(14) A monomer having an amino group, for example, N,N-diethylaminoethyl methacrylate, N,N-dimethylaminoethyl acrylate, N,N-dimethylaminoethyl methacrylate, polybutadiene urethane acrylate, N,N-dimethylaminopropyl acrylamide, N,N-dimethylacrylamide, acryloylmorpholine, N-isopropylacrylamide, or N,N-diethylacrylamide.

Further another monomer may be copolymerized with the above monomer.

As the polymer binder is also preferred an unsaturated bond-containing copolymer which is obtained by reacting a carboxyl group contained in the above vinyl copolymer molecule with for example, a compound having a (meth) acryloyl group and an epoxy group. Examples of the compound having a double bond and an epoxy group in the molecule include glycidyl acrylate, glycidyl methacrylate and an epoxy group-containing unsaturated compound disclosed in Japanese Patent O.P.I. Publication No. 11-27196.

The weight average molecular weight of the above copolymer is preferably 10,000 to 200,000 measured by gel permeation chromatography (GPC), but is not limited thereto.

Anther polymer binder such as a polyvinylbutyral resin, a polyurethane resin, a polyamide resin, a polyester resin, an epoxy resin, a novolak resin, or natural resin can be used together with the above vinyl copolymer, if necessary.

The content of the polymer binder in the light sensitive composition of the invention is preferably from 10 to 90% by weight, more preferably from 15 to 70% by weight, and still more preferably from 20 to 60% by weight, based on the solid components of the composition, in view of sensitivity.

The content of the vinyl copolymer in the light sensitive composition of the invention is preferably from 50 to 1000% by weight, and more preferably from 80 to 100% by weight, based on the polymer binder used.

The acid value of the polymer binder is preferably from 10 to 150, more preferably from 30 to 120, and still more preferably from 50 to 90, in view of balance of polarity of the photopolymerizable light sensitive layer, which can prevent coagulation of pigment used in the photopolymerizable light sensitive layer coating liquid.

(Sensitizing Dye)

When laser is used as a light source, the light sensitive layer in the invention preferably contains a sensitizing dye. A dye having absorption maximum approximate to the emission wavelength of light of the light source is preferred.

Examples of dyes capable of sensitizing to visible to near infrared wavelength regions include cyanine, phthalocyanine, merocyanine, oxonol, porphyrin, a spiro compound, ferrocene, fluorene, fulgide, imidazole, perylene, phenazine, phenothiazine, polyene, an azo compound, diphenylmethane, triphenylmethane, polymethine acridine, cumarin, cumarin derivatives, ketocumarin, quinacridone, indigo, styryl, pyrylium compounds, pyrromethene compounds, pyrazolotriazole compounds, benzothiazole compounds, barbituric acid derivatives, thiobarbituric acid derivatives, ketoalcohol borate complexes, and compound disclosed in EP 568,993, U.S. Pat. Nos. 4,508,811 and 5,227,277, and Japanese-Patent O.P.I. Publication Nos. 2001-125255 and 11-271969. Among these, dyes having a skeleton of cumarin, ketocumarin, oxonol, barbituric acid, pyrromethene borate or diphenylmethane are preferred.

Dyes having absorption maximum in the wavelength range of from 350 to 600 nm, providing desired effects in the composition containing the iron-arene complex and the polyhalogen compound, include xanthenes, acridines, coumarins, and barbituric acid derivatives. A dye represented by formula (10) below is preferred.

Formula (10)

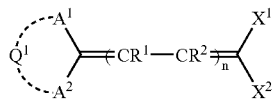

In formula (10), $A^1$ and $A^2$ independently represent a carbon atom or a hetero atom; $Q^1$ represents a non-metallic atomic-group necessary to form a heterocyclic ring together with $A^1$ and $A^2$; $R^1$ and $R^2$ independently represent a hydrogen atom, an alkyl group or an aryl group, provided that $R^1$ and $R^2$ may combine with each other to form a ring; $X^1$ and $X^2$ independently represent a cyano group or a substituted carbonyl group, provided that $X^1$ and $X^2$ may combine with each other to form a ring; and n is an integer of from 0 to 2.

Examples of the sensitizing dye represented by formula (10) will be listed below, but the invention is not limited thereto.

-continued

| Sensitizing dye No. | ![Q1 structure with A1, A2] | ![X1, X2 structure] | ($R^1 = R^2 = H$) n |
|---|---|---|---|
| 6 | benzoxazole, N-C$_2$H$_5$ | =C(COPh)$_2$ (1,3-diphenyl-1,3-dioxopropylidene) | 1 |
| 7 | benzothiazole, N-C$_7$H$_{15}$(n) | =C(CN)$_2$ | 2 |
| 8 | benzoxazole, N-C$_2$H$_5$ | barbiturate with N-CH$_2$CO$_2$CH$_3$ groups | 1 |
| 9 | 3,3-dimethylindoline, N-C$_2$H$_5$ | 2-thiobarbiturate with N-C$_3$H$_7$ groups | 1 |
| 10 | 4,5-diphenylthiazole, N-C$_2$H$_5$ | 2-thiobarbiturate with N-Ph groups | 1 |

As other examples of the dye represented by formula (10), there are those disclosed in Japanese Patent O.P.I. Publication No. 9-328505.

As a dye having absorption maximum in the wavelength range of from 350 to 600 nm, providing more desired effects in the composition containing the iron-arene complex and the polyhalogen compound, there is a dye represented by the following formula (11) or (12).

Formula (11)

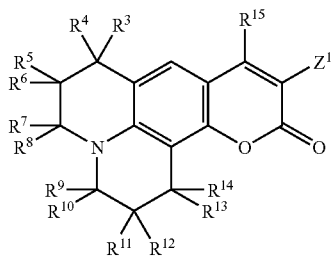

In formula (11), $R^3$, $R^4$, $R^5$, $R^6$, $R^7$, $R^8$, $R^9$, $R^{10}$, $R^{11}$, $R^{12}$, $R^{13}$, $R^{14}$ and $R^{15}$ independently represent a hydrogen atom, an alkyl group, an alkoxy group, an aryl group, a cyano group, a carboxyl group, or an alkyloxycarbonyl group; and $Z^1$ represents an aryl group, a heterocyclic group, or —$COR^{16}$ (in which $R^{16}$ represents an alkyl group, an alkoxy group, an aryl group, an aryloxy group or a heterocyclic group).

Examples of the sensitizing dye represented by formula (11) will be listed below, but the invention is not limited thereto.

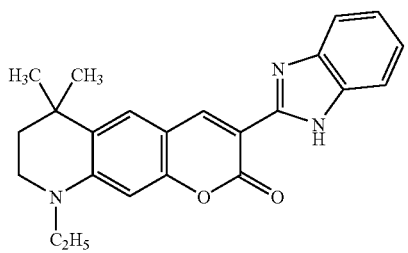

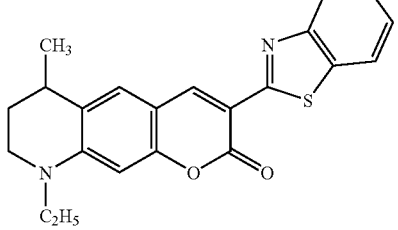

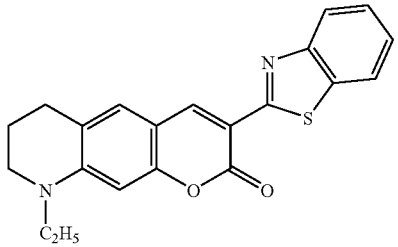

-continued

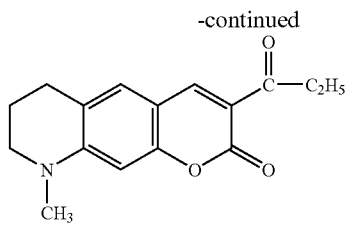

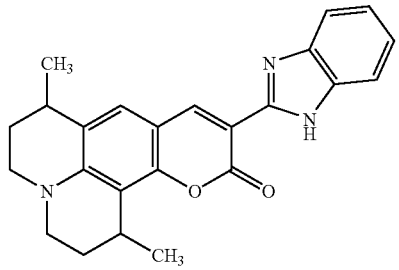

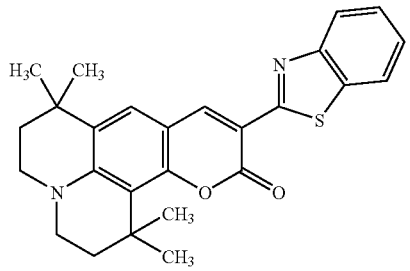

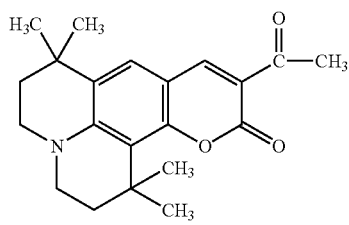

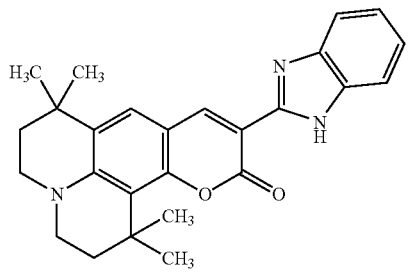

Formula (12)

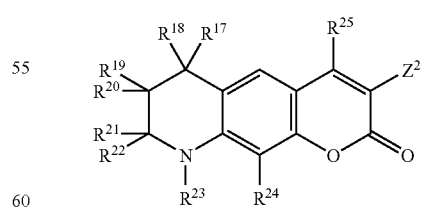

In formula (12), $R^{17}$, $R^{18}$, $R^{19}$, $R^{20}$, $R^{21}$, $R^{22}$, $R^{23}$, $R^{24}$, and $R^{25}$ independently represent a hydrogen atom, an alkyl group, an alkoxy group, an aryl group, a cyano group, a carboxyl group, or an alkyloxycarbonyl group; and $Z^2$ represents an aryl group, a heterocyclic group, or —$COR^{26}$ (in which R[16] represents an alkyl group, an alkoxy group, an aryl group, an aryloxy group or a heterocyclic group).

Examples of the sensitizing dye represented by formula (12) will be listed below, but the invention is not limited thereto.

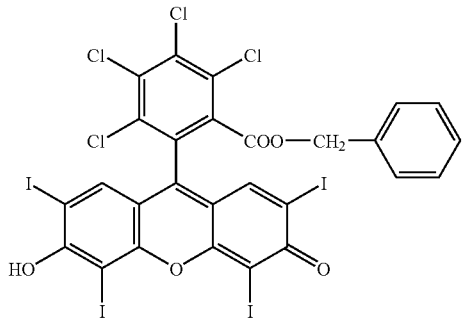

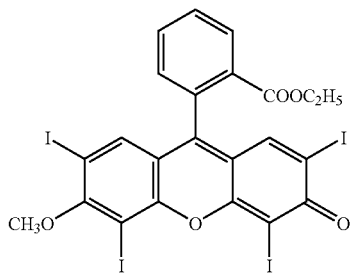

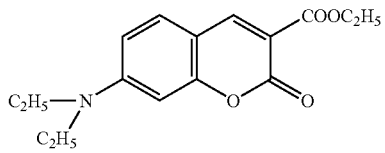

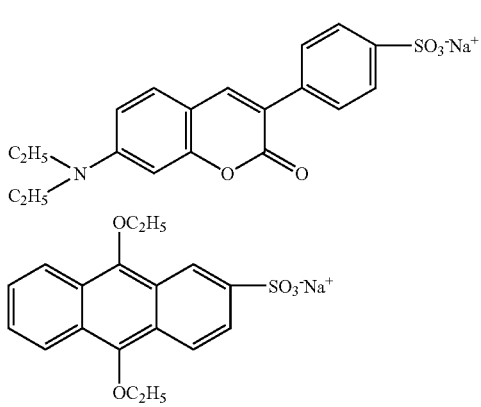

As a dye having absorption maximum in the wavelength range of from 350 to 600 nm, providing more desired effects in the composition containing the iron-arene complex and the polyhalogen compound, there are xanthene dyes such as rose Bengal, Phloxine, erythrosine, eosine and fluoresceine; coumarin dyes; and anthracene dyes.

Examples of these dyes will be listed below, but the invention is not limited thereto.

1.

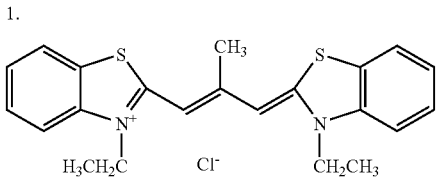

2.

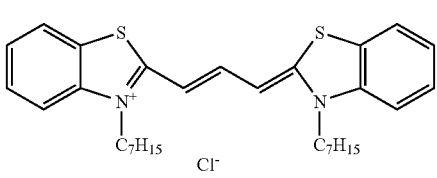

3.

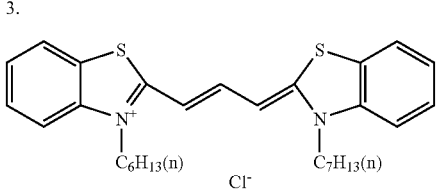

4.

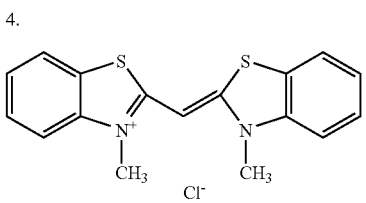

5.

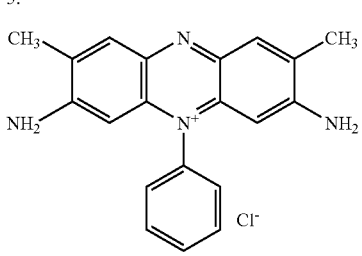

6.

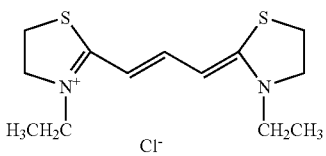

7.

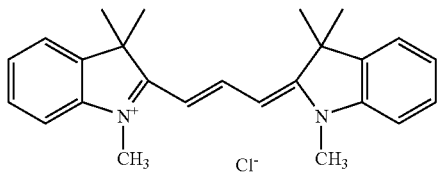

8.

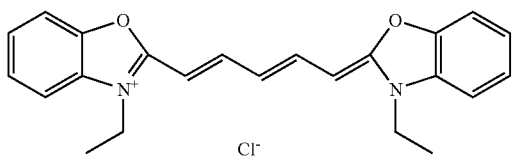

As a dye having absorption maximum in the wavelength range of from 350 to 600 nm, providing more desired effects in the composition containing the iron-arene complex and the polyhalogen compound or in the composition containing the polyhalogen compound, dyes disclosed in Japanese Patent O.P.I. Publication Nos. 2000-98605, 2000-147763, 2000-206690, 2000-258910, 2001-42524, and 2001-100412 are preferred.

A compound represented by formula (13) is more preferred.

Formula (13)

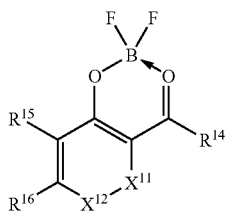

In formula (13), $R^{14}$ represents a hydrogen atom, a substituted or unsubstituted alkyl group, a substituted or unsubstituted alkenyl group, a substituted or unsubstituted aryl group, or a substituted or unsubstituted heterocyclic group; $R^{15}$ and $R^{16}$ combine with each other to form a ring; and $X^{11}$ and $X^{12}$ independently represent —$CR^{17}R^{18}$—, —O—, —S—, or —$NR^{19}$—, in which $R^{17}$, $R^{18}$, and $R^{19}$ independently represent a hydrogen atom, a substituted or unsubstituted alkyl group, a substituted or unsubstituted alkenyl group, a substituted or unsubstituted aryl group, or a substituted or unsubstituted heterocyclic group.

Examples of the alkyl group represented by $R^{14}$ include a methyl group, an ethyl group, a propyl group, a butyl group, a hexyl group, an octyl group, a decyl group, a dodecyl group, an isopropyl group, an isobutyl group, an isopentyl group, a tert-butyl group or a 2-ethylhexyl group. Examples of the alkenyl group represented by $R^{14}$ include a vinyl-group, a 2-propenyl group, or a 3-butenyl group, a 1-methyl-3-propenyl group, 3-pentenyl group, a 1-methyl-3-butenyl group or a 4-hexenyl group. Examples of the aryl group represented by $R^{14}$ include a phenyl group or a naphthyl group. Examples of the heterocyclic group represented by $R^{14}$ include heterocyclic groups derived from 5- or 6-membered heterocyclic rings such as a pyrrole ring, an imidazole ring, a pyrazole ring, an oxazole ring, a thiazole ring, an oxadiazole ring, a thiadiazole ring, a benzimidazole ring, a pyridine ring, a furan ring, a thiophene ring, a coumarone ring, a coumarin ring, a pyrrolidone ring, a piperidine ring, a morpholine ring, a sulfolane ring, a tetrahydrofuran ring, and tetrahydropyrane.

Examples of the substituted or unsubstituted alkyl group, the substituted or unsubstituted alkenyl group the substituted or unsubstituted aryl group or the substituted or unsubstituted heterocyclic group represented by $R^{17}$, $R^{18}$, or $R^{19}$ include the same as those denoted in $R^{14}$ above.

Examples of the sensitizing dye represented by formula (13) will be listed below, but the invention is not limited thereto.

(13-1)

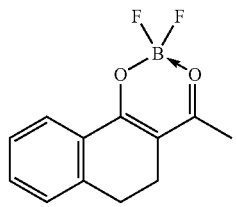

(13-2)

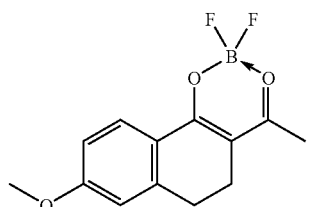

(13-3)

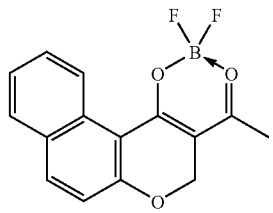

(13-4)

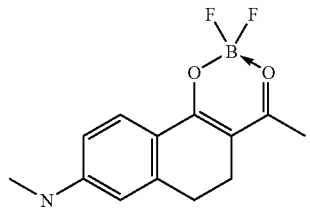

(13-5)

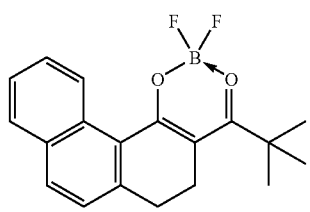

-continued

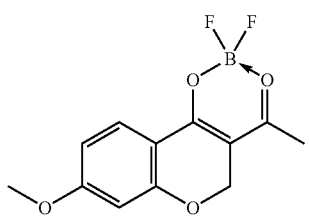

(13-6)

The spectral sensitizing dye represented by formula (13) can be prepared according to conventional synthetic methods well known in the art.

The maximum absorption of the spectral sensitizing dye is determined from the visible light absorption spectra of the dye, which is obtained measurement of an acetonitrile solution of the dye at ordinary temperature. When the dye is insoluble in acetonitrile, a due solution, in which the dye is dissolved in alcohols, 2-butanoe or water, is employed.

In the invention, the spectral sensitizing dye is dissolved in a solvent such as water or an organic solvent to obtain a dye solution, and the dye solution is added to the light sensitive composition. Examples of the organic solvent include alcohols such as methanol, ethanol, propanol or butanol, ketones such as acetone, methyl ethyl ketone, or cyclohexanone, aromatic hydrocarbons such as benzene, toluene, or xylene, glycols such as ethylene glycol, propylene glycol, or hexylene glycol, glycol ethers such as ethyl cellosolve, butyl cellosolve, ethyl carbitol, butyl carbitol, diethyl cellosolve, or diethyl carbitol, N-methyl pyrrolidone, and dimethylformamide. The organic solvents can be used singly or in combination of two or more kinds thereof.

The content of the spectral sensitizing dye in the in the light sensitive composition is not specifically limited, but is preferably from 0.1 to 10 parts by weight, and more preferably from 0.5 to 5 parts by weight, based on 100 parts of the solid components of the light sensitive composition. The content ratio of the photopolymerization initiator to the sensitizing dye in the light sensitive composition is preferably from 1:100 to 100:1 by mole.

Next, various additives which can be added to the light sensitive composition, a support or a protective layer for a light sensitive planographic printing plate material, a method of coating the light sensitive composition on the support, and an image formation method employing the light sensitive planographic printing plate material will be explained.

(Various Additives)

The photopolymerizable light sensitive layer comprising the light sensitive composition in the invention is preferably added with a polymerization inhibitor, in order to prevent undesired polymerization of the ethylenically unsaturated monomer during the manufacture or after storage of the light sensitive planographic printing plate material.

Examples of the polymerization inhibitor include hydroquinone, p-methoxyphenol, di-t-butyl-p-cresol, pyrrogallol, t-butylcatechol, benzoquinone, 4,4'-thiobis (3-methyl-6-t-butylphenol), 2,2'-methylenebis (4-methyl-6-t-butylphenol), N-nitrosophenylhydroxylamine cerous salt, and 2-t-butyl-6-(3-t-butyl-6-hydroxy-5-mrthylbenzyl)-4-methylphenyl acrylate.

The polymerization inhibitor content is preferably 0.01 to 5% by weight based on the total solid content of the light sensitive layer. Further, in order to prevent undesired polymerization induced by oxygen, behenic acid or a higher fatty acid derivative such as behenic amide may be added to the layer. After the light sensitive layer is coated layer, the coated layer may be dried so that the higher fatty acid derivative is localized at the vicinity of the surface of the light sensitive layer. The content of the higher fatty acid derivative is preferably 0.5 to 10% by weight, based on the total solid content of the light sensitive layer.

A colorant can be also used. As the colorant can be used known materials including commercially available materials. Examples of the colorant include those described in revised edition "Ganryo Binran", edited by Nippon Ganryo Gijutu Kyoukai (publishe by Seibunndou Sinkosha), or "Color Index Binran". Pigment is preferred.

Kinds of the pigment include black pigment, yellow pigment, red pigment, brown pigment, violet pigment, blue pigment, green pigment, fluorescent pigment, and metal powder pigment. Examples of the pigment include inorganic pigment (such as titanium dioxide, carbon black, graphite, zinc oxide, Prussian blue, cadmium sulfide, iron oxide, or chromate of lead, zinc, barium or calcium); and organic pigment (such as azo pigment, thioindigo pigment, anthraquinone pigment, anthanthrone pigment, triphenedioxazine pigment, vat dye pigment, phthalocyanine pigment or its derivative, or quinacridone pigment).

Among these pigment, pigment is preferably used which does not substantially have absorption in the absorption wavelength regions of a spectral sensitizing dye used according to a laser for exposure. The absorption of the pigment used is not more than 0.05, obtained from the reflection spectrum of the pigment measured employing an integrating sphere and employing light with the wavelength of the laser used. The pigment content is preferably 0.1 to 10% by weight, and more preferably 0.2 to 5% by weight, based on the total solid content of the photopolymerizable light sensitive layer composition.

When an argon laser (488 nm) or an SHG-YAG laser (532 nm) is used as a light source for exposure, violet pigment or blue pigment is preferably used in view of the above absorption wavelength relationship or image visibility after development. Such pigment examples include Cobalt Blue, cerulean blue, alkali blue lake, Victria Blue lake, metal free phthalocyanine, Phthalocyanine Blue, Fast Sky Blue, Indanthrene Blue, indigo, dioxane violet, isoviolanthrone violet, Indanthrone Blue, and Indanthrene BC. Among these, Phthalocyanine Blue and dioxane violet are preferred.

A surfactant may be added to the layer in order to improve coatability of the layer. A preferred surfactant is a fluorine-contained surfactant.

Further, in order to improve physical properties of the cured light sensitive layer, the layer can contain an inorganic filler or a plasticizer such as dioctyl phthalate, dimethyl phthalate or tricresyl phosphate. The content of such a material is preferably not more than 10% by weight, based on the total solid content of the light sensitive layer.

The solvents used in the preparation of the coating liquid for the photopolymerizable light sensitive layer in the invention include an alcohol such as sec-butanol, isobutanol, n-hexanol, or benzyl alcohol; a polyhydric alcohol such as diethylene glycol, triethylene glycol, tetraethylene glycol, or 1,5-pentanediol; an ether such as propylene glycol monobutyl ether, dipropylene glycol monomethyl ether, or tripropylene glycol monomethyl ether; a ketone or aldehyde such as diacetone alcohol, cyclohexanone, or methyl cyclohexanone; and an ester such as ethyl lactate, butyl lactate, diethyl oxalate, or methyl benzoate.

(Protective Layer or Oxygen Shielding Layer)

(Protective Layer: Oxygen Shielding Layer)

In the invention, a protective layer is preferably provided on the photopolymerizable light sensitive layer. It is preferred that the protective layer (oxygen shielding layer) is highly soluble in the developer as described above (generally an alkaline solution). Polyvinyl alcohol or polyvinyl pyrrolidone is preferably used in the protective layer. Polyvinyl alcohol has the effect of preventing oxygen from transmitting and polyvinyl pyrrolidone has the effect of increasing adhesion between the oxygen shielding layer and the photopolymerizable light sensitive layer adjacent thereto.

Besides the above two polymers, the oxygen shielding layer may contain a water soluble polymer such as polysaccharide, polyethylene glycol, gelatin, glue, casein, hydroxyethyl cellulose, carboxymethyl cellulose, methyl cellulose, hydroxyethyl starch, gum arabic, sucrose octacetate, ammonium alginate, sodium alginate, polyvinyl amine, polyethylene oxide, polystyrene sulfonic acid, polyacrylic acid, or a water soluble polyamide.

In the light sensitive planographic printing plate material in the invention, adhesive strength between the protective layer and the photopolymerizable light sensitive layer is preferably not less than 35 mN/mm, more preferably not less than 50 mN/mm, and still more preferably not less than 75 mN/mm. Preferred composition of the protective layer is disclosed in Japanese Patent Application No. 8-161645.

The adhesive strength in the invention can be measured according to the following procedure.

When an adhesive tape with sufficient adhesive strength having a predetermined width is adhered onto the protective layer, and then peeled at an angle of 90° to the plane of the light sensitive planographic printing plate precursor, strength necessary to peel the protective layer from the photopolymerizable light sensitive layer is measured as-the adhesive strength.

The protective layer may further contain a surfactant or a matting agent. The protective layer is formed, coating on the photopolymerizable light sensitive layer a coating solution in which the above protective layer composition is dissolved in an appropriate coating solvent, and drying. The main solvent of the coating solution is preferably water or an alcohol solvent such as methanol, ethanol, or iso-propanol.

The thickness of the protective layer is preferably 0.1 to 5.0 µm, and more preferably 0.5 to 3.0 µm.

(Support)

As the supports used in the invention, an aluminum plate having a hydrophilic surface is used, and the aluminum plate may be a pure aluminum plate or an aluminum alloy plate. As the aluminum alloy, there can be used various ones including an alloy of aluminum and a metal such as silicon, copper, manganese, magnesium, chromium, zinc, lead, bismuth, nickel, titanium, sodium or iron.

It is preferable that the support in the invention is subjected to degreasing treatment for removing rolling oil prior to surface roughening (graining). The degreasing treatments include degreasing treatment employing solvents such as trichlene and thinner, and an emulsion degreasing treatment employing an emulsion such as kerosene or triethanol. It is also possible to use an aqueous alkali solution such as caustic soda for the degreasing treatment. When an aqueous alkali solution such as caustic soda is used for the degreasing treatment, it is possible to remove soils and an oxidized film which can not be removed by the above-mentioned degreasing treatment alone. When an aqueous alkali solution such as caustic soda is used for the degreasing treatment, the resulting support is preferably subjected to desmut treatment in an aqueous solution of an acid such as phosphoric acid, nitric acid, sulfuric acid, chromic acid, or a mixture thereof, since smut is produced on the surface of the support.

As the surface roughening method, an electrolytic surface roughening method is carried out, but prior to the electrolytic surface roughening, a mechanical surface roughening method can be carried out.

Though there is no restriction for the mechanical surface roughening method, a brushing roughening method and a honing roughening method are preferable. The brushing roughening method is carried out by rubbing the surface of the support with a rotating brush with a brush hair with a diameter of 0.2 to 0.8 mm, while supplying slurry in which volcanic ash particles with a particle size of 10 to 100 µm are dispersed in water to the surface of the support. The honing roughening method is carried out by ejecting obliquely slurry with pressure applied from nozzles to the surface of the support, the slurry containing volcanic ash particles with a particle size of 10 to 100 µm dispersed in water. A surface roughening can be also carried out by laminating a support surface with a sheet on the surface of which abrading particles with a particle size of from 10 to 100 µm was coated at intervals of 100 to 200 µm and at a density of $2.5 \times 10^3$ to $10 \times 10^3 / cm^2$, and applying pressure to the sheet to transfer the roughened pattern of the sheet and roughen the surface of the support.

After the support has been roughened mechanically, it is preferably dipped in an acid or an aqueous alkali solution in order to remove abrasives and aluminum dust, etc. which have been embedded in the surface of the support. Examples of the acid include sulfuric acid, persulfuric acid, hydrofluoric acid, phosphoric acid, nitric acid and hydrochloric acid, and examples of the alkali include sodium hydroxide and potassium hydroxide. Among those mentioned above, an aqueous alkali solution of for example, sodium hydroxide is preferably used. The dissolution amount of aluminum in the support surface is preferably 0.5 to 5 g/m². After the support has been dipped in the aqueous alkali solution, it is preferable for the support to be dipped in an acid such as phosphoric acid, nitric acid, sulfuric acid and chromic acid, or in a mixed acid thereof, for neutralization.

In the electrolytic surface roughening method in the invention, the electrolytically surface roughening is carried out in an acidic electrolytic solution. The electrolytically surface roughening is carried out at a current density (in effective value) of from 30 to 100 A/dm² for 10 to 120 seconds in a hydrochloric acid or nitric acid electrolytic solution, the concentration of hydrochloric acid or nitric acid being from 0.4 to 2.8% by weight. The concentration of hydrochloric acid or nitric acid in the hydrochloric acid or nitric acid electrolytic solution is preferably 1.0 to 2.3% by weight. The current density is preferably from 30 to 80 A/dm², and more preferably from 40 to 75 A/dm².

There is no limitation to temperature at which the electrolytically surface roughening is carried out, the temperature is preferably from 5 to 80° C., and more preferably from 10 to 60° C. There is no limitation to voltage applied at which the electrolytically surface roughening is carried out, the voltage is preferably from 30 to 80 V, and preferably from 40 to 75 V. There is no limitation to quantity of electricity, the quantity of electricity is preferably from 100 to 5000 C/dm², and more preferably 100 to 2000 C/dm².

It is possible to optionally add, to the electrolytic solution, nitrates, chlorides, amines, aldehydes, phosphoric acid, chromic acid, boric acid, acetic acid or oxalic acid.

After the support has been electrolytically surface roughened, it is preferably dipped in an acid or an aqueous alkali solution in order to remove aluminum dust, etc. produced in the surface of the support. Examples of the acid include sulfuric acid, persulfuric acid, hydrofluoric acid, phosphoric acid, nitric acid and hydrochloric acid, and examples of the alkali include sodium hydroxide and potassium hydroxide. Among those mentioned above, the aqueous alkali solution is preferably used. The dissolution amount of aluminum in the support surface is preferably 0.5 to 5 g/m². After the support has been dipped in the aqueous alkali solution, it is preferable for the support to be dipped in an acid such as phosphoric acid, nitric acid, sulfuric acid and chromic acid, or in a mixed acid thereof, for neutralization.

After the surface roughening, anodizing treatment may be carried out. There is no restriction in particular for the method of anodizing treatment used in the invention, and known methods can be used. The anodizing treatment forms an anodization film on the surface of the support. For the anodizing treatment there is preferably used a method of applying a current density of from 1 to 10 A/dm² to an aqueous solution containing sulfuric acid and/or phosphoric acid in a concentration of from 10 to 50%, as an electrolytic solution. However, it is also possible to use a method of applying a high current density to sulfuric acid as described in U.S. Pat. No. 1,412,768, a method to electrolytically etching the support in phosphoric acid as described in U.S. Pat. No. 3,511,661, or a method of employing a solution containing two or more kinds of chromic acid, oxalic acid, malonic acid, etc. The coated amount of the formed anodization film is suitably 1 to 50 mg/dm², and preferably 10 to 40 mg/dm². The coated amount of the formed anodization film can be obtained from the weight difference between the aluminum plates before and after dissolution of the anodization film. The anodization film of the aluminum plate is dissolved employing for example, an aqueous phosphoric acid chromic acid solution which is prepared by dissolving 35 ml of 85% by weight phosphoric acid and 20 g of chromium (IV) oxide in 1 liter of water.

It is preferred in the invention that the support after anodizing treatment is treated in a sodium silicate solution at 20 to 50° C. The treatment is carried out preferably at 20 to 50° C., and more preferably at 20 to 45° C. Temperature less than 20° C. results in lowering of a stain elimination property, while temperature exceeding 50° C. results in lowering of printing durability. There is no limitation as to a sodium silicate concentration in the sodium silicate solution, the concentration is preferably from 0.01 to 35%, and more preferably from 0.1 to 5%.

It is preferred in the invention that the support after anodizing treatment is treated in a polyvinyl phosphonic acid solution at 20 to 70° C. The treatment is carried out preferably at 20 to 70° C., and more preferably at 30 to 65° C. Temperature less than 20° C. results in lowering of a stain elimination property, while temperature exceeding 70° C. results in lowering of printing durability. There is no limitation as to a polyvinyl phosphonic acid concentration in the polyvinyl phosphonic acid solution, the concentration is preferably from 0.01 to 35%, and more preferably from 0.1 to 5%.

(Coating)

The prepared coating liquid for the photopolymerizable light sensitive layer is coated on the support according to a conventional method, and dried to obtain a light sensitive planographic printing plate precursor. Examples of the coating method include an air doctor coating method, a blade coating method, a wire bar coating method, a knife coating method, a dip coating method, a reverse roll coating method, a gravure coating method, a cast coating method, a curtain coating method, and an extrusion coating method.

A low drying temperature of the coated photopolymerizable light sensitive layer cannot provide sufficient printing durability, while too a high drying temperature of the coated photopolymerizable light sensitive layer results in marangoni and produces fog at non-image portions. The drying temperature is preferably from 60 to 160° C., more preferably from 80 to 140° C., and still more preferably from 90 to 120° C.

(Image Formation Method)

As a light source for forming an image on the planographic printing plate material in the invention, is used. As the laser, argon laser, He—Ne gas laser, YAG laser or semi-conductor laser is preferably used. In the invention, a laser emitting light having visible wavelengths is preferably used. Typically, images are preferably formed employing a laser having light with a wavelength regions of from 350 to 450 nm or a laser having light with a wavelength regions of from 470 to 550 nm.

As a laser scanning method by means of a laser beam, there are a method of scanning on an outer surface of a cylinder, a method of scanning on an inner surface of a cylinder and a method of scanning on a plane. In the method of scanning on an outer surface of a cylinder, laser beam exposure is conducted while a drum around which a recording material is wound is rotated, in which main scanning is represented by the rotation of the drum, while sub-scanning is represented by the movement of the laser beam. In the method of scanning on an inner surface of a cylinder, a recording material is fixed on the inner surface of a drum, a laser beam is emitted from the inside, and main scanning is carried out in the circumferential direction by rotating a part of or an entire part of an optical system, while sub-scanning is carried out in the axial direction by moving straight a part of or an entire part of the optical system in parallel with a shaft of the drum. In the method of scanning on a plane, main scanning by means of a laser beam is carried out through a combination of a polygon mirror, a galvano mirror and an Fθ lens, and sub-scanning is carried out by moving a recording medium. The method of scanning on an outer surface of a cylinder and the method of scanning on an inner surface of a cylinder are suitable for high density image recording, since it is easier to increase accuracy of an optical system.

(Preheating)

In the invention, the exposed planographic printing plate material can be subjected to heat treatment before or during development. Such a heat treatment can improve adhesion between the support and the light sensitive photopolymerizable layer, which enhances the effect of the invention.

Regarding heat treatment, there is, for example, a developing machine in which a preheating roller for preheating an exposed planographic printing plate material to a predetermined temperature is arranged upstream a development section where the preheating is carried out before development. The preheating roller is a roller comprised of a pair of rollers, at least one of the pair of the rollers having a heating means within the roller. The roller having a heating means in it is a pipe of a metal with high thermal conductivity such as aluminum or iron, the pipe having a nichrome wire as a heating element. The outside surface of the pipe may be covered with a sheet of a plastic such as polyethylene, polystyrene or Teflon. Details of such a preheating roller can refer to Japanese Patent O.P.I. Publication No. 64-80962.

In the invention, it is preferred that the preheating is carried out at 70 to 180° C. for 3 to 120 seconds.

(Developer)

It is preferred in the invention that the protective layer of an exposed planographic printing plate material is removed with water prior to development. When the exposed planographic printing plate material is processed employing an automatic developing machine, it is preferred that the exposed planographic printing plate material, after the protective layer is removed with water before the processing, is processed in the automatic developing machine, or that the exposed planographic printing plate material is processed in an automatic developing machine equipped with a pre-washing tank charged with washing water upstream the developing tank, the protective layer being removed in the pre-washing tank.

In the invention, the imagewise exposed light sensitive layer, which are cured are at exposed portions, is developed with an alkali developer, whereby the light sensitive layer at non-exposed portions are removed to form an image.

As the alkali developer, a conventional alkali aqueous solution is used. For example, there is an alkali developer containing an inorganic alkali agent such as sodium silicate, potassium silicate, ammonium silicate, sodium secondary phosphate, potassium secondary phosphate, ammonium secondary phosphate; sodium hydrogen carbonate, potassium hydrogen carbonate, ammonium hydrogen carbonate; sodium carbonate, potassium carbonate, ammonium carbonate; sodium borate, potassium borate, lithium borate; sodium hydroxide, potassium hydroxide, and ammonium hydroxide.

The alkali developer can contain organic alkali agents such as monomethylamine, dimethylamine, trimethylamine, monoethylamine, diethylamine, triethylamine, monoisopropylamine, diisopropylamine, triisopropylamine, n-butylamine, monoethanolamine, diethanolamine, triethanolamine, monoisopropanolamine, diisopropanolamine, ethyleneimine, ethylenediamine, and pyridine.

These alkali agents can be used-singly or as a mixture of two or more thereof. The alkali developer can contain an anionic surfactant, an amphoteric surfactant, or an organic solvent such as alcohol.

EXAMPLES

Next, synthetic example, a method of preparing a support, and examples will be explained, but the present invention is not limited thereto. In the examples, "parts" represents "parts by weight", unless otherwise specified.

Example 1

<<Synthesis of Polymer Binder>>

(Synthesis of Acryl Copolymer 1)

Thirty parts of methacrylic acid, 50 parts of methyl methacrylate, 20 parts of ethyl methacrylate, 500 parts of isopropyl alcohol, and 3 parts of $\alpha,\alpha'$-azobisisobutyro-nitrile were put in a three neck flask under nitrogen atmosphere, and reacted under nitrogen atmosphere for 6 hours at 80° C. in an oil bath. After that, the reaction mixture was refluxed at a boiling point of isopropyl alcohol for one hour, and 3 parts of triethylbenzylammonium chloride and 25 parts of glycidyl methacrylate were further added to the mixture, and reacted for additional 3 hours. Thus, acryl copolymer 1 was obtained. The weight average molecular weight of the acryl copolymer 1 was 35,000, measured according to GPC. The glass transition temperature Tg of the acryl copolymer 1 was 85° C., measured according to DSC (differential thermal analysis).

(Preparation of Support)

A 0.3 mm thick aluminum plate (material 1050, refining H16) was degreased at 60° C. for one minute in a 5% sodium hydroxide solution, washed with water, immersed at 25° C. for one minute in 10% hydrochloric acid solution to neutralize, and then washed with water. The resulting aluminum plate was electrolytically etched using an alternating current at 25° C. for 60 seconds at a current density of 100 A/dm$^2$ in a 0.3 weight % nitric acid solution, desmut at 60° C. for 10 seconds in a 5% sodium hydroxide solution. The desmut aluminum plate was anodized at 25° C. for 1 minute at a current density of 10 A/dm$^2$ and at a voltage of 15 V in a 15% sulfuric acid solution, and further subjected to hydrophilization at 75° C. in a 1% polyvinyl phosphonic acid solution. Thus, support was obtained. The center line average surface roughness (Ra) of the support was 0.65 µm.

<<Preparation of Planographic Printing Plate Material Sample>>

The following photopolymerizable light sensitive layer coating solution 1 was coated on the resulting support through a wire bar, and dried at 95° C. for 1.5 minutes to give a light sensitive layer having a dry thickness of 1.5 g/m$^2$. Thus, light sensitive planographic printing plate material sample was obtained.

(Photopolymerizable Light Sensitive Layer Coating Solution 1)

Compound having a group capable amount as shown in Table 1 of undergoing radical polymerization (as shown in Table 1)

Compound having a group capable amount as shown in Table 1 of undergoing cationic polymerization (as shown in Table 1)

Photopolymerization initiator amount as shown in Table 1 (as shown in Table 1)

| | |
|---|---|
| Spectral sensitizing dye DR-1 (below) | 2.0 parts |
| Acryl copolymer 1 | 40.0 parts |
| N-Phenylglycine benzyl ester | 2.0 parts |
| 2-Mercaptobenzothiazole | 2.0 parts |
| Phthalocyanine pigment<br>(MHI 454 produced by Mikuni Sikisosha) | 6.0 parts |
| 2-t-Butyl-6-(3-t-butyl-2-hydroxy-5-<br>methylbenzyl)-4-methylphenylacrylate<br>(Sumirizer GS: produced by Sumitomo 3M Co., Ltd.) | 0.5 parts |
| Decanedioic acid bis-<br>(2,2,6,6-tetramethyl-piperidin-4-yl) ester<br>(ADK STAB LA-770, produced by Asahi Denka Co., Ltd.) | 0.1 parts |
| Fluorine-contained surfactant<br>(F-178K: produced by Dainippon Ink Co., Ltd.) | 0.2 parts |
| Fluorine-contained surfactant<br>(FC-430: produced by 3M Co., Ltd.) | 0.2 parts |
| Methyl ethyl ketone | 80 parts |
| Cyclohexanone | 820 parts |

The following oxygen shielding layer coating solution 1 was coated on the photopolymerizable light sensitive layer using an applicator, and dried at 75° C. for 1.5 minutes to give an oxygen shielding layer with a dry thickness of 1.8 g/m². Thus, light sensitive planographic printing plate material samples 1 through 11 were prepared.

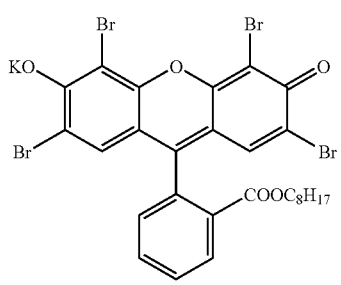

DR-1

(Oxygen Shielding Layer Coating Solution 1)

| | |
|---|---|
| Polyvinyl alcohol (GL-05, produced<br>by Nippon Gosei Kagaku Co., Ltd.) | 84.5 parts |
| Polyvinyl Pyrrolidone (K-30,<br>produced by ISP Japan Co., Ltd.) | 15.0 parts |
| Surfactant (Surfinol 465,<br>produced by Nisshin Kagaku Kogyo Co., Ltd.) | 0.5 parts |
| Water | 900 parts |

(Evaluation of Planographic Printing Plate Material Sample)

(Sensitivity)

The light sensitive planographic printing plate material sample obtained above was imagewise exposed at a resolving degree of 2400 dpi, employing a plate setter (Tiger Cat, produced by ECRM Co., Ltd.) equipped with a 532 nm light source). Herein, dpi represents the dot numbers per 2.54 cm.

The image pattern used for the exposure comprised a solid image and a square dot image with a screen number of 175 lpi (lpi means a line number per 2.54 cm) and a 50% dot area. Subsequently, the exposed sample was subjected to development treatment employing a CTP automatic developing machine (PHW 23-V produced by Technigraph Co., Ltd.) to obtain a planographic printing plate. Herein, the developing machine comprised a pre-heating section for preheating the sample at 110° C. for 10 seconds, a pre-washing section for removing the oxygen shielding layer before development, a development section charged with developer having the following developer composition, a washing section for removing the developer remaining on the developed sample after development, and a gumming section charged with a gumming solution (a solution obtained by diluting GW-3, produced by Mitsubishi Chemical Co., Ltd., with water by a factor of 2) for protecting the surface of the developed sample. Thus, planographic printing plate sample was obtained.

The lowest exposure energy amount reproducing the solid image above in the resulting planographic printing plate sample with no reduction of the layer thickness at the solid image portions was defined as recording energy and evaluated as a measure of sensitivity. The less the recording energy is, the higher the sensitivity. The results are shown in Table 1.

<Composition of Developer (Aqueous Solution Containing the Following Components)>

| | |
|---|---|
| Potassium silicate aqueous solution | 8.0% by weight |
| Newcol B-13SN (produced by<br>Nippon Nyukazai Co., Ltd.) | 1.0% by weight |
| PRONON #204 (produced by<br>Nippon Yushi Co., Ltd.) | 1.0% by weight |
| DAPE-0215 (produced by<br>Nippon Emulsion Co., Ltd.) | 1.0% by weight |
| Potassium hydroxide | amount giving pH 12.3 |

(Printing Durability)

The printing plate material sample obtained above was exposed at an exposure amount of 200 μJ/cm², employing an image with a screen line number of 175, and developed with the developer, whereby a printing plate was obtained. Employing the resulting printing plate, printing was carried out on a press (DAIYA1F-1 produced by Mitsubishi Jukogyo Co., Ltd.), wherein a coat paper, printing ink (Soybean oil ink, "Naturalith 100" produced by Dainippon Ink Kagaku Co., Ltd.), and dampening water (SG-51, H solution produced by Tokyo Ink Co., Ltd., Concentration: 1.5%) were used. The number of prints printed from when printing started until when dot reduction at a highlight portions was produced was defined as a measure of printing durability.

The results are shown in Table 1.

TABLE 1

| Sample No. | Compound having a group capable of undergoing radical polymerization | Compound having a group capable of undergoing cationic polymerization | Photopolymerization initiator 1 | Photopolymerization initiator 2 | Recording energy ($\mu j/cm^2$) | Printing durability | Remarks |
|---|---|---|---|---|---|---|---|
| 1 | MR-1: 10 parts MR-2: 5 parts MR-3: 10 parts | Exemplified Compound 9: 5 parts Exemplified Compound 12: 5 parts | IA-1: 3 parts | BR22: 3 parts | 20 | 600,000 | Inv. |
| 2 | MR-1: 10 parts MR-2: 5 parts MR-3: 10 parts | Exemplified Compound 9: 5 parts Exemplified Compound 12: 5 parts | IA-1: 3 parts | TZ-4: 3 parts | 20 | 700,000 | Inv. |
| 3 | MR-1: 10 parts MR-2: 5 parts MR-3: 10 parts | Exemplified Compound 9: 5 parts Exemplified Compound 12: 5 parts | IA-7: 3 parts | CL49: 3 parts | 25 | 550,000 | Inv. |
| 4 | MR-1: 10 parts MR-2: 5 parts MR-3: 10 parts | Exemplified Compound 9: 5 parts Exemplified Compound 12: 5 parts | IA-7: 3 parts | BR50: 3 parts | 20 | 600,000 | Inv. |
| 5 | MR-1: 10 parts MR-2: 5 parts MR-3: 10 parts | M101: 10 parts | IA-1: 3 parts | BR22: 3 parts | 20 | 750,000 | Inv. |
| 6 | MR-1: 10 parts MR-2: 5 parts MR-3: 10 parts | M201: 10 parts | IA-1: 3 parts | BR22: 3 parts | 20 | 750,000 | Inv. |
| 7 | MR-1: 10 parts MR-2: 5 parts MR-3: 10 parts | M301: 10 parts | IA-1: 3 parts | BR22: 3 parts | 20 | 700,000 | Inv. |
| 8 | MR-1: 10 parts MR-2: 5 parts MR-3: 10 parts | M103: 10 parts | IA-1: 3 parts | BR22: 3 parts | 20 | 700,000 | Inv. |
| 9 | MR-1: 10 parts MR-2: 5 parts MR-3: 10 parts | None | IA-7: 3 parts | TZ-4: 3 parts | 40 | 400,000 | Comp. |
| 10 | MR-1: 10 parts MR-2: 5 parts MR-3: 10 parts | Exemplified Compound 9: 5 parts Exemplified Compound 12: 5 parts | IA-7: 3 parts | None | 300 | 5,000 | Comp. |
| 11 | MR-1: 10 parts MR-2: 5 parts MR-3: 10 parts | Exemplified Compound 9: 5 parts Exemplified Compound 12: 5 parts | None | TZ-4: 3 parts | No image formed | — | Comp. |

Inv.: Invention,

Comp.: Comparative

MR-1: NK OligoU4HA produced by Shinakamura Kagaku Co., Ltd.

MR-2: Tetraethylene glycol dimethacrylate

MR-3: Reaction product of 1 mol of n-butyl-di(hydroxyethyl)amine, 2 mol of tetramethylxylene diisocyanate and 2 mol of 2-hydroxy-3-acryloyloxypropyl methacrylate As is apparent from Table 1 above, the inventive samples provide high sensitivity and high printing durability as compared with comparative samples.

Example 2

Light sensitive planographic printing plate material samples 21 through 31 were prepared in the same manner as in Example 1 above, except that the spectral sensitizing dye was changed to DY-2 below, and the compound having a group capable of undergoing radical polymerization, the compound having a group capable of undergoing cationic polymerization, and the photopolymerization initiator were changed to those as shown in Table 2.

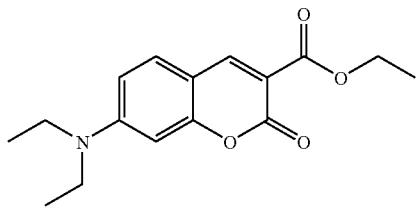

DY-2

<<Evaluation of Planographic Printing Plate Material Sample>>

The resulting planographic printing plate material samples were evaluated in the same manner as in Example 1 above, except that the samples were exposed employing a plate setter (a modified exposure device of Tiger Cat, produced by ECRM Co., Ltd.) equipped with a 408 nm light source with a 30 mW output power), and were exposed at an exposure amount of 200 µJ/cm² for evaluation of printing durability.

The results are shown in Table 2.

TABLE 2

| Sample No. | Compound having a group capable of undergoing radical polymerization | Compound having a group capable of undergoing cationic polymerization | Photopolymerization initiator 1 | Photopolymerization initiator 2 | Recording energy (µj/cm²) | Printing durability | Remarks |
|---|---|---|---|---|---|---|---|
| 21 | MR-1: 10 parts<br>MR-2: 5 parts<br>MR-3: 10 parts | Exemplified Compound 9: 5 parts<br>Exemplified Compound 12: 5 parts | IA-1: 3 parts | BR22: 3 parts | 20 | 400,000 | Inv. |
| 22 | MR-1: 10 parts<br>MR-2: 5 parts<br>MR-3: 10 parts | Exemplified Compound 9: 5 parts<br>Exemplified Compound 12: 5 parts | IA-1: 3 parts | TZ-4: 3 parts | 15 | 500,000 | Inv. |
| 23 | MR-1: 10 parts<br>MR-2: 5 parts<br>MR-3: 10 parts | Exemplified Compound 9: 5 parts<br>Exemplified Compound 12: 5 parts | IA-7: 3 parts | CL49: 3 parts | 20 | 500,000 | Inv. |
| 24 | MR-1: 10 parts<br>MR-2: 5 parts<br>MR-3: 10 parts | Exemplified Compound 9: 5 parts<br>Exemplified Compound 12: 5 parts | IA-7: 3 parts | BR50: 3 parts | 15 | 400,000 | Inv. |
| 25 | MR-1: 10 parts<br>MR-2: 5 parts<br>MR-3: 10 parts | M101: 10 parts | IA-1: 3 parts | BR22: 3 parts | 10 | 600,000 | Inv. |
| 26 | MR-1: 10 parts<br>MR-2: 5 parts<br>MR-3: 10 parts | M201: 10 parts | IA-1: 3 parts | BR22: 3 parts | 12 | 500,000 | Inv. |
| 27 | MR-1: 10 parts<br>MR-2: 5 parts<br>MR-3: 10 parts | M301: 10 parts | IA-1: 3 parts | BR22: 3 parts | 10 | 500,000 | Inv. |
| 28 | MR-1: 10 parts<br>MR-2: 5 parts<br>MR-3: 10 parts | M103: 10 parts | IA-1: 3 parts | BR22: 3 parts | 12 | 500,000 | Inv. |
| 29 | MR-1: 10 parts<br>MR-2: 5 parts<br>MR-3: 10 parts | None | IA-7: 3 parts | TZ-4: 3 parts | 40 | 200,000 | Comp. |
| 30 | MR-1: 10 parts<br>MR-2: 5 parts<br>MR-3: 10 parts | Exemplified Compound 9: 5 parts<br>Exemplified Compound 12: 5 parts | IA-7: 3 parts | None | 200Z | 3,000 | Comp. |
| 31 | MR-1: 10 parts<br>MR-2: 5 parts<br>MR-3: 10 parts | Exemplified Compound 9: 5 parts<br>Exemplified Compound 12: 5 parts | None | TZ-4: 3 parts | No image formed | — | Comp. |

Inv.: Invention,
Comp.: Comparative

As is apparent from Table 2 above, the inventive samples provide high sensitivity and high printing durability as compared with comparative samples.

EFFECT OF THE INVENTION

The present invention can provide a light sensitive composition, a light sensitive planographic printing plate material, and a manufacturing method of a printing plate providing high sensitivity and excellent printing durability.

What is claimed is:

1. A light sensitive composition containing a compound A having a group capable of undergoing radical polymerization, a compound B having a group capable of undergoing cationic polymerization, a photopolymerization initiator C, and a polymer binder D, wherein the photopolymerization initiator C comprises an iron-arene complex and a halogenated alkyl group-containing compound.

2. The light sensitive composition of claim 1, wherein the halogenated alkyl group-containing compound is at least one selected from the group consisting of a trichloromethyl group-containing compound, a tribromomethyl group-containing compound, a dichloromethyl group-containing compound, and a dibromomethyl group-containing compound.

3. The light sensitive composition of claim 1, wherein the compound B having the group capable of undergoing cationic polymerization further has a group capable of undergoing radical polymerization, the group capable of undergoing cationic polymerization comprising any one of an oxirane ring, an oxetane ring and a dioxolane ring in the chemical structure.

4. The light sensitive composition of claim 1, wherein the compound B is a compound represented by the following formula (A):

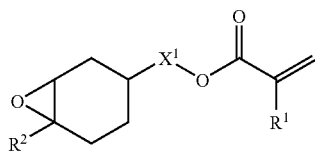

Formula (A)

wherein $R^1$ represents a hydrogen atom, or a methyl group; $R^2$ represents an alkyl group; and $X^1$ represents a single bond or a divalent organic group.

5. The light sensitive composition of claim 1, wherein the compound B is at least one selected from the group consisting of a compound represented by the following formula (B) and a compound represented by the following formula (C):

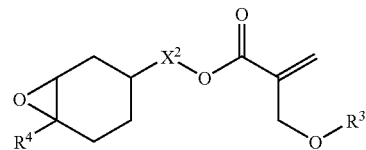

Formula (B)

wherein $R^3$ represents a substituted or unsubstituted alkyl group, a substituted or unsubstituted aryl group or a substituted or unsubstituted acyl group; $R^4$ represents a hydrogen atom or an alkyl group; and $X^2$ represents a single bond or a divalent organic group,

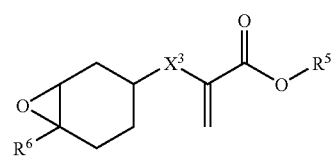

Formula (C)

wherein $R^5$ represents a substituted or unsubstituted alkyl group or a substituted or unsubstituted aryl group; $R^6$ represents a hydrogen atom or an alkyl group; and $X^3$ represents a single bond or a divalent organic group.

6. A light sensitive planographic printing plate material comprising a support having a hydrophilic surface, and coated on the hydrophilic surface, the light sensitive composition of claim 1.

7. A process of manufacturing a planographic printing plate, the process comprising the step of:
 imagewise exposing the light sensitive planographic printing plate material of claim 6, employing a laser emitting light with a wavelength of from 350 to 450 nm to record an image.

8. A process of manufacturing a planographic printing plate, the process comprising the step of:
 imagewise exposing the light sensitive planographic printing plate material of claim 6, employing a laser emitting light with a wavelength of from 470 to 550 nm to record an image.

* * * * *